United States Patent
Yam et al.

(10) Patent No.: US 12,239,014 B2
(45) Date of Patent: Feb. 25, 2025

(54) LUMINESCENT GOLD(III) COMPOUNDS WITH THERMALLY STIMULATED DELAYED PHOSPHORESCENCE (TSDP) PROPERTY FOR ORGANIC LIGHT-EMITTING DEVICES AND THEIR PREPARATION

(71) Applicant: THE UNIVERSITY OF HONG KONG, Hong Kong (CN)

(72) Inventors: Vivian Wing-Wah Yam, Hong Kong (CN); Man-Chung Tang, Hong Kong (CN); Ming-Yi Leung, Hong Kong (CN); Shiu-Lun Lai, Hong Kong (CN); Mei-Yee Chan, Hong Kong (CN)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 735 days.

(21) Appl. No.: 16/959,462

(22) PCT Filed: Jan. 2, 2019

(86) PCT No.: PCT/CN2019/070126
§ 371 (c)(1),
(2) Date: Jul. 1, 2020

(87) PCT Pub. No.: WO2019/134651
PCT Pub. Date: Jul. 11, 2019

(65) Prior Publication Data
US 2021/0074933 A1 Mar. 11, 2021

Related U.S. Application Data

(60) Provisional application No. 62/612,792, filed on Jan. 2, 2018.

(51) Int. Cl.
*C07F 1/00* (2006.01)
*C09K 11/06* (2006.01)
(Continued)

(52) U.S. Cl.
CPC ............ *H10K 85/371* (2023.02); *C07F 1/00* (2013.01); *C09K 11/06* (2013.01);
(Continued)

(58) Field of Classification Search
CPC .................. H10K 85/371; H10K 85/30–381
See application file for complete search history.

(56) References Cited

U.S. PATENT DOCUMENTS

2006/0091378 A1* 5/2006 Yam .......................... C07F 1/00
257/40
2009/0278453 A1* 11/2009 Yam ..................... H10K 85/371
546/4

(Continued)

FOREIGN PATENT DOCUMENTS

| CN | 101098946 A | 1/2008 | |
|---|---|---|---|
| JP | 2007053132 A | 3/2007 | |
| WO | WO-2006045235 A1 * | 5/2006 | ................ C07F 1/00 |

OTHER PUBLICATIONS

Wong, K. M.; Zhu, X.; Hung, L.L.; Zhu, N.; Yam, Y.W.; Kwok, H.S.; 2005, A novel class of phosphorescent gold(III) alkynyl-based organic light-emitting devices with tunable color, Chem. Commun., 2906-2908 (Year: 2005).*

(Continued)

*Primary Examiner* — Jennifer A Boyd
*Assistant Examiner* — Rachel Simbana
(74) *Attorney, Agent, or Firm* — Leason Ellis LLP

(57) ABSTRACT

A novel class of gold (III) compounds with thermally stimulated delayed phosphorescence (TSDP) properties, methods of making and use thereof are disclosed. The gold (III) compound includes a triazine-containing cyclometalating tridentate ligand and one auxiliary ligand, both coordinated to a gold (III) metal center. The gold (III) compounds can be used as light-emitting material for fabrication of OLEDs. A novel concept of TSDP to harvest light emission (Continued)

Pathway A: Conventional phosphorescent blue emitters
Max. IQE: 100 %

Pathway B: TSDP blue emitters
Max. IQE: 100 %

$k_{PP}$ = Rate of prompt phosphorescence
$k_{DP}$ = Rate of delayed phosphorescence
$k_{nr}$ = Rate of non-radiative decay
$k_{IC}$ = Rate of internal conversion
$k_{RIC}$ = Rate of reverse internal conversion
$k_{ISC}$ = Rate of intersystem crossing
$k_{decomp}$ = Rate of photochemical decomposition from the higher energy triplet excited state via the up-conversion from the lowest-energy triplet excited state by efficient spin-allowed reverse internal conversion is also disclosed.

26 Claims, 13 Drawing Sheets

(51) Int. Cl.
  H05B 33/14    (2006.01)
  H10K 50/11    (2023.01)
  H10K 85/30    (2023.01)
  H10K 101/10   (2023.01)

(52) U.S. Cl.
  CPC ............... C09K 2211/1007 (2013.01); C09K 2211/1029 (2013.01); C09K 2211/1044 (2013.01); C09K 2211/188 (2013.01); H10K 50/11 (2023.02); H10K 2101/10 (2023.02)

(56) References Cited

U.S. PATENT DOCUMENTS

| | | | |
|---|---|---|---|
| 2011/0012099 A1* | 1/2011 | Yersin | C09K 11/06 252/500 |
| 2013/0193428 A1* | 8/2013 | Yam | H05B 33/14 548/103 |
| 2013/0334519 A1* | 12/2013 | Lang | H10K 85/371 257/40 |
| 2017/0047532 A1* | 2/2017 | Lee | C07F 15/0093 |

OTHER PUBLICATIONS

Au, V. K.; Wong, K. M.; Tsang, D. P.; Chan, M. Y.; Zhu, N.; Yam, V. W.; 2010, High-Efficiency Green Organic Light-Emitting Devices Utilizing Phosphorescent Bis-cyclometalated Alkylnylgold(III) Complexes, J. Am. Chem. Soc., 132, 14273-14278 (Year: 2010).*

Au, V.K.; Tsang, D.P.; Wong, K. M.; Chan, M. Y.; Zhu, N.; Yam, V.W.; 2013, Functionalized Bis-Cyclometalated Alkynylgold(III) Complexes: Synthesis, Characterization, Electrochemistry, Photophysics, Photochemistry, and Electroluminescence Studies, Inorg. Chem., 52, 12713-12735 (Year: 2013).*

Tang, M-C et al. "Versatile Design Strategy for Highly Luminescent Vacuum-Evaporable and Solution-Processable Tridentate Gold(III) Complexes with Monoaryl Auxilary Ligands and Their Applications for Phosphorescent Organic Light Emitting Devices", , J. Am. Chem Soc, 2017, 139, 9341-9349.

International Search Report and Written Opinion in Corresponding PCT Application No. PCT/CN2019/070126 mailed Apr. 11, 2019. 10 pages.

International Preliminary Report on Patentability in Corresponding PCT Application No. PCT/CN2019/070126 mailed Apr. 20, 2020. 15 pages.

Tang, C et al. . "Organic electroluminescent diodes." Applied physics letters 51.12 (1987): 913-915.

Burroughes, Jeremy H., et al. "Light-emitting diodes based on conjugated polymers." nature 347.6293 (1990): 539-541.

Burrows, Paul E et al. . "Prospects and applications for organic light-emitting devices." Current Opinion in Solid State and Materials Science 2.2 (1997): 236-243.

Baldo, Marc A., et al. "Highly efficient phosphorescent emission from organic electroluminescent devices." Nature 395.6698 (1998): 151-154.

Wong, Keith Man-Chung, et al. "A novel class of phosphorescent gold (III) alkynyl-based organic light-emitting devices with tunable colour." Chemical communications 23 (2005): 2906-2908.

Yam, Vivian Wing-Wah, et al. "Luminescent gold (III) alkynyl complexes: Synthesis, structural characterization, and luminescence properties." Angewandte Chemie 117.20 (2005): 3167-3170.

Wong, Keith Man-Chung, et al. "A Class of Luminescent Cyclometalated Alkynylgold (III) Complexes: Synthesis, Characterization, and Electrochemical, Photophysical, and Computational Studies of [Au (C N C)(C : CR)](C N C= κ3C, N, C Biscyclometalated 2, 6-Diphenylpyridyl)." Journal of the American Chemical Society 129.14 (2007): 4350-4365.

Au, Vonika Ka-Man, et al. "High-efficiency green organic light-emitting devices utilizing phosphorescent bis-cyclometalated alkynylgold (III) complexes." Journal of the American Chemical Society 132.40 (2010): 14273-14278.

Tang, Man-Chung, et al. "Dendritic Luminescent Gold (III) Complexes for Highly Efficient Solution-Processable Organic Light-Emitting Devices." Angewandte Chemie 125.1 (2013): 464-467.

Tang, Man-Chung, et al. "Saturated Red-Light-Emitting Gold (III) Triphenylamine Dendrimers for Solution-Processable Organic Light-Emitting Devices." Chemistry—A European Journal 20.46 (2014): 15233-15241.

Lee, Chin-Ho, et al. "Sky-blue-emitting dendritic alkynylgold (III) complexes for solution-processable organic light-emitting devices." Journal of the American Chemical Society 139.30 (2017): 10539-10550.

Wong, Ben Yiu-Wing, et al. "Versatile Synthesis of Luminescent Tetradentate Cyclometalated Alkynylgold (III) Complexes and Their Application in Solution-Processable Organic Light-Emitting Devices." Angewandte Chemie 129.1 (2017): 308-311.

Parker, C. A., and C. G. Hatchard. "Triplet-singlet emission in fluid solutions. Phosphorescence of eosin." Transactions of the Faraday Society 57 (1961): 1894-1904.

Blasse, George, and David R. McMillin. "On the luminescence of bis (triphenylphosphine) phenanthroline copper(I)." Chemical Physics Letters 70.1 (1980): 1-3.

Berberan-Santos, Mario N., and Joao MM Garcia. "Unusually strong delayed fluorescence of C70." Journal of the American Chemical Society 118.39 (1996): 9391-9394.

Endo, A., et al. "TADF from Sn4+—Porphyrin Complexes and Their Application to Organic Light-Emitting Diodes 焊 a Novel Mechanism for Electroluminescence." Adv. Mater 21 (2009): 4802-4806.

Endo, Ayataka, et al. "Efficient up-conversion of triplet excitons into a singlet state and its application for organic light emitting diodes." Applied Physics Letters 98.8 (2011): 42.

Kaji, Hironori, et al. "Purely organic electroluminescent material realizing 100% conversion from electricity to light." Nature communications 6 (2015): 8476.

Joyama, Hiroki, et al. "Highly efficient organic light-emitting diodes from delayed fluorescence." Nature 492.7428 (2012): 234-238.

Lin, Ting-An, et al. "Sky-blue organic light emitting diode with 37% external quantum efficiency using thermally activated delayed fluorescence from spiroacridine-triazine hybrid." Advanced Materials 28.32 (2016): 6976-6983.

Li, J., et al. "Highly Efficient Organic Light-Emitting Diodes Based on a Hidden TADF Channel in a Heptazine Derivative." Adv. Mater 25 (2013): 3319-3323.

Li, Weijun, et al. "A hybridized local and charge-transfer excited state for highly efficient fluorescent oleds: Molecular design, spectral character, and full exciton utilization." Advanced Optical Materials 2.9 (2014): 892-901.

Li, Weijun, et al. "Employing~ 100% Excitons in OLEDs by utilizing a fluorescent molecule with hybridized local and charge-transfer excited state." Advanced Functional Materials 24.11 (2014): 1609-1614.

Wang, Chu, et al. "Highly efficient nondoped green organic light-emitting diodes with combination of high photoluminescence and high exciton utilization." ACS Applied Materials & Interfaces 8.5 (2016): 3041-3049.

Tang, Xiangyang, et al. "Efficient deep blue electroluminescence with an external quantum efficiency of 6.8% and CIE y< 0.08 based on a phenanthroimidazole—sulfone hybrid donor—acceptor molecule." Chemistry of Materials 27.20 (2015): 7050-7057.

Adamson, Arthur W. "The Thermally Equilibrated Excited (Thexi) State Chemistry of Some Co (III) Ammines." 1976. 128-148.

Chan et al. "Strongly luminescent cyclometalated gold (III) complexes supported by bidentate ligands displaying intermolecular

(56) References Cited

OTHER PUBLICATIONS interactions and tunable emission energy." Chemistry—An Asian Journal 12.16 (2017): 2104-2120.

Cheng et al. "Color Tunable Organic Light-Emitting Devices with External Quantum Efficiency over 20% Based on Strongly Luminescent Gold (III) Complexes having Long-Lived Emissive Excited States." Advanced Materials 26.16 (2014): 2540-2546.

Chinese Office Action for corresponding Chinese Patent Application No. 201980007327.2 issued Feb. 3, 2023. 18 pages.

Fernandez-Cestau et al. "Synthesis and luminescence modulation of pyrazine-based gold (III) pincer complexes." Chemical Communications 51.93 (2015): 16629-16632.

Fernandez-Cestau et al. "Synthesis, structures, and properties of luminescent (C N C) gold (III) alkyl complexes: Correlation between photoemission energies and C—H acidity." Organometallics 36.17 (2017): 3304-3312.

Maity et al. "Suzuki-Miyaura coupling of arylboronic acids to gold (III)." Chemical Science 6.2 (2015): 981-986.

To et al. "Highly Luminescent Pincer Gold (III) Aryl Emitters: Thermally Activated Delayed Fluorescence and Solution-Processed OLEDs." Angewandte Chemie International Edition 56.45 (2017): 14036-14041.

\* cited by examiner

LUMINESCENT GOLD(III) COMPOUNDS WITH THERMALLY STIMULATED DELAYED PHOSPHORESCENCE (TSDP) PROPERTY FOR ORGANIC LIGHT-EMITTING DEVICES AND THEIR PREPARATION

FIELD

Described herein are a novel class of gold(III) compounds that display a novel concept of thermally stimulated delayed phosphorescence (TSDP) as well as the development of a new class of TSDP emitters as exemplified by the novel class of gold(III) compounds with TSDP properties and the syntheses of these compounds. Also disclosed herein are compounds that can be used as light-emitting materials for phosphorescent organic light-emitting devices (PHOLEDs) and methods of making and using the compounds themselves.

BACKGROUND

Taking the advantages of low cost, light weight, low power consumption, high brightness, excellent color tunability, wide viewing angle of up to 180 degrees as well as their ease of fabrication onto flexible substrates, organic light-emitting devices (OLEDs) are considered to be remarkably attractive candidates for flat panel display technologies and solid-state lighting systems. Typically, an OLED consists of several layers of semiconductors sandwiched between two electrodes. The cathode is composed of a low work function metal or metal alloy deposited by vacuum evaporation, whereas the anode is a transparent conductor such as indium tin oxide (ITO). Upon application of a direct current (DC) voltage, holes injected from the ITO anode and electrons injected from the metal cathode will recombine to form excitons. Subsequent relaxation of excitons then results in the generation of electroluminescence (EL).

The breakthroughs that led to the exponential growth of this field and to its first commercialized products can be traced to two pioneering demonstrations. In 1987, Tang and VanSlyke [Tang, C. W.; VanSlyke, S. A. *Appl. Phys. Lett.* 51, 913 (1987)] proposed the use of a double-layer structure of vacuum deposited, small-molecular films, in which tris(8-hydroxyquinoline)aluminum ($Alq_3$) was utilized both as light-emitting layer and electron-transporting layer. Later, the first polymeric light-emitting device was pioneered by Burroughs et al. in 1990 [Burroughes, J. H.; Bradley, D. D. C.; Brown, A. R.; Marks, R. N.; Mackay, K.; Friend, R. H.; Burns, P. L.; Holmes, A. B. *Nature* 347, 539 (1990)], in which a yellow-green EL from poly(p-phenylenenvinylene) (PPV) was achieved. Since then, a number of electroluminescent small molecule based and polymeric light-emitting materials have been investigated with improved light-emitting properties. The key advantage of using polymers as light-emitting materials is that they are highly soluble in most organic solvents, and OLEDs can be easily fabricated by using low-cost and efficient wet-processing techniques, such as spin-coating, screen-printing, or ink-jet printing [Burrows, P. E.; Forrest, S. R.; Thompson, M. E. *Curr. Opin. Solid State Mater. Sci.* 2, 236 (1997)].

In 1998, Forrest and Thompson demonstrated the use of a transition metal complex, 2,3,7,8,12,13,17,18-octaethyl-21H,23H-porphine platinum(II) [Pt(OEP)] as emitter and fabricated highly efficient phosphorescent OLEDs with external quantum efficiency (EQE) of approximately 4% [Baldo, M. A.; O'Brien, D. F.; You, Y; Shoustikov, A.; Sibley, S.; Thompson, M. E.; Forrest, S. R. *Nature* 395, 151 (1998)]. The introduction of a heavy metal center into an organic framework can effectively lead to a strong spin-orbit coupling and thus promote an efficient intersystem crossing from the singlet excited state to the lower-energy triplet excited state to give phosphorescence. This can result in theoretically a four-fold enhancement in the internal quantum efficiency (IQE) of the OLEDs up to 100% upon the harvesting of both triplet and singlet excitons. This breakthrough has aroused enormous research interest on the development of high performance triplet emitters based on iridium(III) and platinum(II) systems, and highly efficient OLEDs with EQEs of up to 30% have been recently achieved.

In addition to the well-established iridium(III) and platinum(II) systems, cyclometalated gold(III) complexes are another class of promising phosphorescent emitters because of their high luminescence quantum yields, short excited-state lifetimes, and high thermal and electrochemical stabilities. In 2005, Yam and co-workers incorporated strong 6-donating alkynyl ligands into the gold(III) framework and generated a series of bis-cyclometalated alkynylgold(III) compounds. These gold(III) complexes exhibit rich luminescence behaviors at both room and low temperatures in various media [Wong, K. M.-C.; Zhu, X.; Hung, L.-L.; Zhu, N.; Yam, V. W.-W.; Kwok, H.-S. *Chem. Commun.* 2906 (2005); Yam, V W.-W.; Wong, K. M.-C.; Hung, L.-L.; Zhu, N. *Angew. Chem. Int. Ed.* 44, 3107 (2005); Wong, K. M.-C.; Hung, L.-L.; Lam, W. H.; Zhu, N.; Yam, V. W.-W. *J. Am. Chem. Soc.* 129, 4350 (2007)]. Notably, the emission colors of these gold(III) complexes can be fine-tuned to span the entire visible spectrum by variation of different substituents on the cyclometalating pincer or alkynyl ligands. High performance OLEDs with current efficiency of 37.4 cd $A^1$ and EQEs of 11.5% have also been reported [Au, V. K.-M.; Wong, K. M.-C.; Tsang, D. P.-K.; Chan, M.-Y; Zhu, N.; Yam, V. W.-W. *J. Am. Chem. Soc.* 132, 14273 (2010)]. Recently, the same research group also developed new classes of solution-processable gold(III) complexes by incorporating the gold(III) emitter within a dendritic structure [Tang, M.-C.; Tsang, D. P.-K.; Chan, M. M.-Y; Wong, K. M.-C.; Yam, V. W.-W. *Angew. Chem. Int. Ed.* 52, 446 (2013); Tang, M.-C.; Chan, C. K.-M.; Tsang, D. P.-K.; Wong, Y-C.; Chan, M. M.-Y; Wong, K. M.-C.; Yam, V W.-W. *Chem. Eur. J.* 20, 15233 (2014); Lee, C.-H.; Tang, M.-C.; Wong, Y-C.; Chan, M.-Y; Yam, V W.-W. *J. Am. Chem. Soc.* 139, 10539 (2017)]. Meanwhile, bipolar gold (III) complexes having N-phenylbenzimidazole as an acceptor and triphenylamine as a donor have been developed [Tang, M.-C.; Tsang, D. P.-K.; Wong, Y-C.; Chan, M.-Y; Wong, K. M.-C.; Yam, V. W.-W. *J. Am. Chem. Soc.* 136, 17861 (2014)]. Solution-processable OLEDs with high EQE of up to 10% and an extremely small efficiency roll-off value of less than 1% at the practical brightness level of 1000 cd $m^2$ have been demonstrated. The recent use of post-synthetic ligand modification approach has generated a new class of tetradentate gold(III) complexes with high thermal stability and extraordinarily high photoluminescence quantum yields (PLQYs) of up to 78% have been realized [Wong, B. Y-W.; Wong, H.-L.; Wong, Y-C.; Chan, M.-Y; Yam, V W.-W. *Angew. Chem. Int. Ed.* 56,302 (2017)].

Remarkable discoveries on metal-free organic materials with thermally activated delayed fluorescence (TADF) properties have injected a new twist to the field of OLEDs. In particular, a rational design on the molecular structure to generate a small energy gap between the lowest energy triplet ($T_1$) state and the lowest energy singlet ($S_1$) state can make possible the up-conversion from the triplet excitons to the singlet excitons by reverse intersystem-crossing (RISC). The newly generated singlet excitons then decay through radiative transition and give out delayed fluorescence (DF). With a high rate of RISC and small energy gaps between $S_1$ and $T_1$, a 100% exciton utilization can be achieved. The first report on TADF can be dated back to 1961, contributed by Parker and Hatchard in the eosin dye, and was subsequently named "E-type" delayed fluorescence. The second band of long-lived emission besides phosphorescence was found to be of identical profile as the prompt fluorescence band, and was assigned to be DF from the same excited singlet state [Parker, C. A.; Hatchard, C. G. *Trans. Faraday Society* 57, 1894 (1961)]. The first metal-containing TADF material was observed in a copper(I) complex by Blasse and co-workers in 1980, in which another emission mechanism with two excited states in thermal equilibrium was proposed [Blasse, G.; McMillin, D. R. *Chem. Phys. Lett.* 70, 1 (1980)]. In the late 1990s, the efficient delayed fluorescence was further verified in fullerenes by Berberan-Santos and co-workers, with the derivation of rate equations to describe the mechanism [Berberan-Santos, M. N.; Garcia, J. M. M. *J. Am. Chem. Soc.* 118, 9391 (1996)]. Despite the early success of the research on TADF, this type of material was not applied on OLEDs until 2009, pioneered by Adachi and co-workers, who realized TADF based OLEDs by utilizing a Sn(IV)-porphyrin complex [Endo, A.; Ogasawara, M.; Takahashi, A.; Yokoyama, D.; Kato, Y.; Adachi, C. *Adv. Mater.* 21, 4802 (2009)]. Continuing this concept, the same group reported the first purely organic TADF emitter in 2011, which showed a 5.3% EQE in OLEDs, approaching the theoretical practical limit for singlet emitters [Endo, A.; Sato, K.; Yoshimura, K.; Kai, T.; Kawada, A.; Miyazaki, H.; Adachi, C. *Appl. Phys. Lett.* 98, 083302 (2011)]. In 2012, a series of organic TADF emitters were reported by the same group, in which an EQE of 19.3% was achieved in the best performing devices, well-beyond the theoretical practical maximum of 5% for singlet emitters [Uoyama, H.; Goushi, K.; Shizu, K.; Nomura, H.; Adachi, C. *Nature* 492, 234 (2012)]. Since then, TADF emitters have been an important topic in both academic and industrial research. With the continuous effort of researchers in this field, EQEs of OLEDs have been reported reaching 36.7% for blue [Lin, T.-A.; Chatterjee, T.; Tsai, W.-L.; Lee, W.-K.; Wu, M.-J.; Jiao, M.; Pan, K.-C.; Yi, C.-L.; Chung, C.-L.; Wong, K.-T.; Wu, C.-C. *Adv. Mater.* 28, 6976 (2016)], 29.6% for green [Kaji, H.; Suzuki, H.; Fukushima, T.; Shizu, K.; Suzuki, K.; Kubo, S.; Komino, T.; Oiwa, H.; Suzuki, F.; Wakamiya, A.; Murata, Y; Adachi, C. *Nat. Commun.* 6, 8476 (2015)] and 17.5% for red [Li, J.; Nakagawa, T.; MacDonald, J.; Zhang, Q.; Nomura, H.; Miyazaki, H.; Adachi, C. *Adv. Mater.* 25, 3319 (2013)].

Apart from RISC from the lowest-energy $T_1$ state to the $S_1$ state to generate fluorescence, RISC can also occur from the higher triplet T excited states to the $S_1$ state provided that the energy gap between the $S_1$ and T excited states are sufficiently small. This allows the emitters to effectively harvest both singlet and triplet excitons, as reported by Ma and co-workers in 2014 [Li, W.; Pan, Y; Yao, L.; Liu, H.; Zhang, S.; Wang, C.; Shen, F.; Lu, P.; Yang, B.; Ma, Y *Advanced Optical Materials* 2, 892 (2014)].

Another approach to harvest all singlet and triplet excitons is the effective mixing of localized electron (LE) state and charge transfer (CT) state to form the hybridized local and charge transfer (HLCT) state [Li, W.; Pan, Y; Xiao, R.; Peng, Q.; Zhang, S.; Ma, D.; Li, F.; Shen, F.; Wang, Y; Yang, B.; Ma, Y *Adv. Funct. Mater.* 24, 1609 (2014)]. The weak binding energy of the CT state allows the spin mixing between singlet and triplet states, in which a spin flip between singlet and triplet excitons becomes feasible, achieving singlet exciton harvesting with a singlet-to-triplet ratio of larger than 25%. Yet, the forbidden electronic transition from the total spatial separation of orbitals generally results in very low fluorescence efficiency. Meanwhile, the LE state is a highly efficient radiative state, arising from its large transition dipole moment with a larger orbital overlap. By mixing the above-mentioned states into the HLCT state, both singlet and triplet excitons can be harvested with high efficiency. Recently, OLEDs utilizing the HLCT state with decent EQEs have been reported; in particular, a maximum EQE of 2.8% for deep red[Li, W.; Pan, Y.; Yao, L.; Liu, H.; Zhang, S.; Wang, C.; Shen, F.; Lu, P.; Yang, B.; Ma, Y. *Advanced Optical Materials* 2, 892 (2014)], 6.9% for green [Wang, C.; Li, X.; Pan, Y.; Zhang, S.; Yao, L.; Bai, Q.; Li, W.; Lu, P.; Yang, B.; Su, S.; Ma, Y. *ACS Appl. Mater. Interfaces* 8, 3041 (2016)], and 6.8% for deep blue emission have been demonstrated, respectively [Tang, X.; Bai, Q.; Peng, Q.; Gao, Y.; Li, J.; Liu, Y.; Yao, L.; Lu, P.; Yang, B.; Ma, Y. *Chem. Mater.* 27, 7050 (2015)].

At the same time, the concept of thermally equilibrated excited (thexi) states has been introduced to discuss the thermal equilibrium between two excited states in 1976, similar to the TADF [Adamson, A. W. *Inorganic Compounds with Unusual Properties* 128 (1976)]. However, such excited states are in thermodynamic equilibrium with the surroundings and are the high-energy isomers of the ground state. The transfer of excitons between thexi states usually involves reaction of excited states, such as the ligand field substitutional photochemistry of trans- and cis-[Co(en)$_2$(NH$_3$)Cl]$^{2+}$, but is not related to emissive states and luminescence.

However, the known methods described above have drawbacks. Even though superior EL efficiency has been achieved in blue-emitting OLEDs, their operational stability is much more inferior when compared to their red- and green-emitting OLED counterparts. The direct formation of high energy triplet excitons tends to facilitate the dissociation of chemical bonds, rendering the development of stable deep blue triplet emitters more challenging. Thus, the field has a need to develop emitters that emit in the desirable high-energy blue region, but possess the lowest-energy triplet state in the blue-green or green region to minimize photodegradation of the chemical bonds, i.e., the triplet emission comes from a higher-energy triplet ($T_1'$) state rather than the lowest-energy triplet ($T_1$) state.

It is in regard to these issues and others that the present disclosure is provided.

BRIEF SUMMARY

In one or more embodiments, compounds having properties of thermally stimulated delayed phosphorescence (TSDP) are provided. In one or more embodiments, the compounds capable of TSDP are formed as TSDP emitters. In one or more embodiments, a novel class of gold(III) compounds having a triazine-containing cyclometalating tridentate ligand that exhibits TSDP properties and their syntheses is provided. In one or more embodiments, OLEDs based on these novel luminescent gold(III) compounds with TSDP properties are provided.

The novel TSDP is realized by using efficient spin-allowed RIC to harvest emission from the higher-energy $T_1'$ excited state via the up-conversion from the $T_1$ state.

In one or more embodiments, the novel luminescent gold(III) compounds contain a triazine-containing cyclometalating tridentate ligand and one strong σ-donating group, both coordinated to a gold(III) metal center.

In one or more embodiments, novel luminescent gold(III) compounds with TSDP properties have the chemical structure shown in the generic formula (I) and (II) are provided,

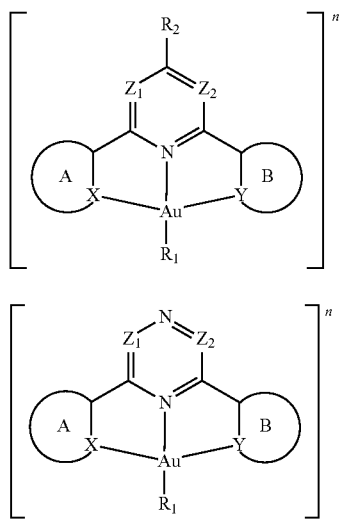

in which:
(a) X, Y, $Z_1$ and $Z_2$ are each nitrogen or carbon;
(b) A and B are cyclic structure derivatives of unsubstituted or substituted phenyl groups or heterocyclic groups;
(c) $R_1$ is any carbon or heteroatom donor ligand, halide or pseudohalide, which could be either monoanionic or neutral. $R_1$ is selected from, but not limited to, alkyl, substituted alkyl, aryl, substituted aryl, heteroaryl, substituted heteroaryl, heterocyclic, substituted heterocyclic, alkynyl, substituted alkynyl, alkoxy, amide, thiolate, phosphide, chloride, bromide, iodide, cyanate, thiocyanate or cyanide;
(d) $R_2$ is any carbon or heteroatom ligand, halide or pseudohalide, which could be either monoanionic or neutral. $R_2$ is selected from, but not limited to, alkyl, substituted alkyl, aryl, substituted aryl, heteroaryl, substituted heteroaryl, heterocyclic, substituted heterocyclic, alkynyl, substituted alkynyl, alkoxy, amide, thiolate, phosphide, chloride, bromide, iodide, cyanate, thiocyanate or cyanide; and
(e) n is zero, a positive integer or a negative integer.

In one or more embodiments, the compound is deposited as a thin layer on a substrate. For example, the thin layer can be deposited by vacuum deposition, spin-coating, or inkjet printing. In one or more embodiments, the luminescent gold(III) compounds disclosed herein are deposited as a thin layer on a substrate layer. In one or more embodiments, the thickness of the deposited gold(III) compound is 10-20 nm, 21-30 nm, 31-40 nm, 41-50 nm, 51-60 nm, 61-70 nm, 71-80 nm, 81-90 nm, or 91-100 nm. Further, the compound has photoluminescence properties within a range of about 380 to 1050 nm.

In one or more embodiments, the gold(III) compound is a dopant in the light-emitting layer or emissive layer of an OLED. For example, an emission energy of the OLED can be independent or dependent on the concentration of the gold(III) compound and one or more donor groups on an auxiliary ligand, in which the one or more donor groups are selected from, but not limited to: N, S, O, P.

In accordance one or more embodiments disclosed herein, the novel class of gold(III) compounds show either strong photoluminescence (PL) via a triplet excited state upon photo-excitation, or EL via a triplet exciton upon application of a DC voltage. These compounds according to one or more embodiments are highly soluble in common organic solvents, such as dichloromethane, chloroform, toluene and others. Alternatively, the compounds can be non-doped or doped into a host matrix for thin film preparation by either vacuum deposition, spin-coating, ink-jet printing or other known fabrication methods. In some embodiments, the compounds can be used for the fabrication of OLEDs as phosphorescent emitters or dopants to generate EL.

In an OLED according to one or more embodiments disclosed herein, the luminescent gold(III) compound is included in a light-emitting layer or emissive layer. The typical structure of an OLED using luminescent compounds of the present disclosure as a light-emitting layer or emissive layer is in the order shown in FIG. 3: cathode/electron-transporting layer/luminescent gold(III) compound or any TSDP emitter as an emissive layer/hole-transporting layer/anode. In one or more embodiments, a hole-blocking layer and a carrier confinement layer are employed to improve the device performance. Device structures with modifications to include various carrier blocking layers, carrier injection layer and interlayers are also used to improve the device performance.

Furthermore, a method for preparing luminescent gold (III) compounds with a triazine-containing cyclometalating tridentate ligand that exhibit TSDP properties and at least one aryl or alkynyl group, both coordinated to a gold(III) metal center is provided in one or more embodiments herein. The method includes a reaction according to:

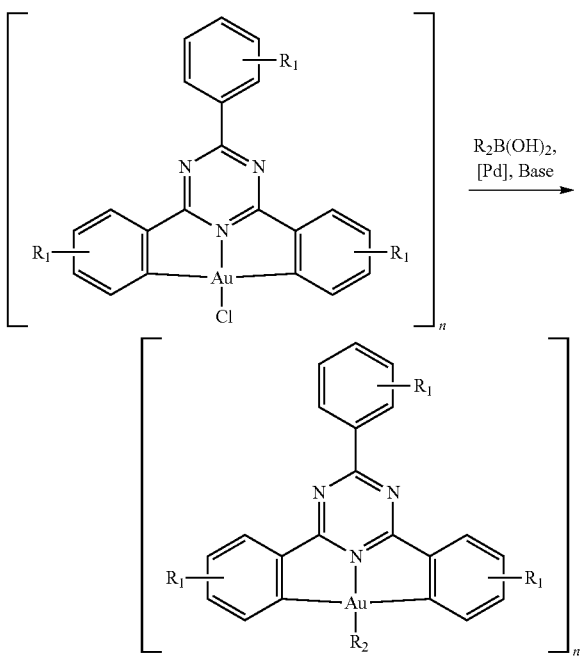

-continued

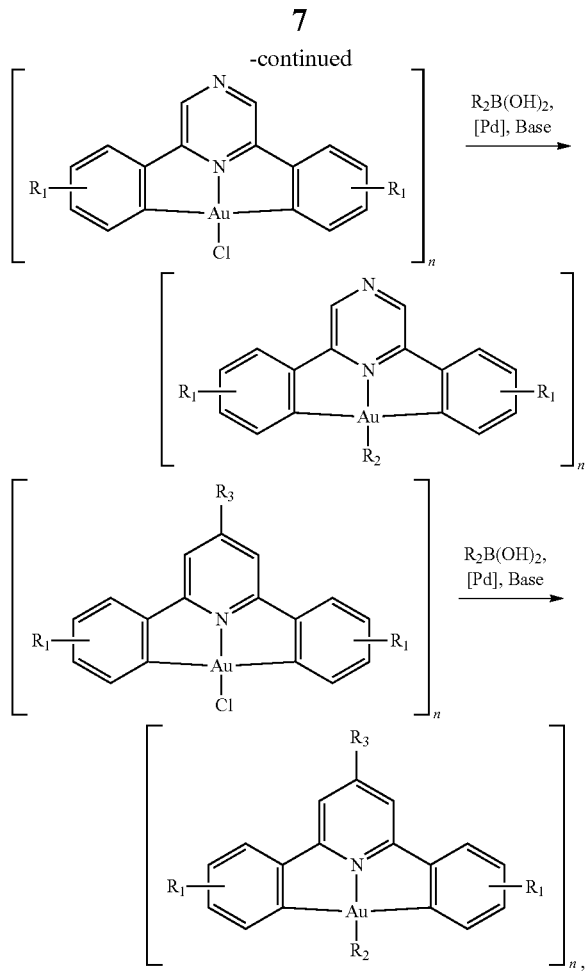

in which:
(a) R$_1$ and R$_3$ are selected from, but are not limited to, alkyl, alkenyl, alkynyl, alkylaryl, aryl and cycloalkyl with one or more alkyl, alkenyl, alkynyl, alkylaryl, cycloalkyl, OR, NR$_2$, SR, C(O)R, C(O)OR, C(O)NR$_2$, CN, CF$_3$, NO$_2$, SO$_2$, SOR, SO$_3$R, halo, aryl, substituted aryl, heteroaryl, substituted heteroaryl or a heterocyclic group, wherein R is independently alkyl, alkynyl, alkylaryl, aryl or cycloalkyl. R$_1$ could also be heteroatom and is selected from, but not limited to, nitrogen, oxygen, sulphur or phosphorus;
(b) R$_2$ is selected from, but is not limited to, alkyl, substituted alkyl, aryl, substituted aryl, heteroaryl, substituted heteroaryl, heterocyclic, substituted heterocyclic, alkynyl or substituted alkynyl; and
(c) n is zero, a positive integer or a negative integer.

Moreover, in one or more embodiments a light-emitting device with an ordered structure comprising an anode, a hole-transporting layer, a light-emitting layer, an electron-transporting layer and a cathode wherein the light-emitting layer comprises a gold(III) compound as disclosed herein. In one or more embodiments, the light-emitting layer or emissive layer is prepared using vacuum deposition or solution processing technique.

BRIEF DESCRIPTION OF THE DRAWINGS

The disclosure is illustrated in the figures of the accompanying drawings which are meant to be exemplary and not limiting, in which like references are intended to refer to like or corresponding parts, and in which.

DETAILED DESCRIPTION

One aspect of the subject matter described herein is the novel concept of thermally stimulated delayed phosphorescence (TSDP) as well as the development of a new class of TSDP emitters, as exemplified by a novel class of tridentate-ligand containing luminescent gold(III) compounds with TSDP properties for applications in OLEDs. The gold(III) compounds are coordination compounds that contain one strong σ-donating group and one cyclometalating tridentate ligand, both coordinated to a gold(III) metal center. Other embodiments are directed to OLEDs based on this class of luminescent gold(III) compounds and methods related thereto. The TSDP compounds harvest light emission from the higher energy triplet excited state via the up-conversion from the lowest-energy triplet excited state by efficient spin-allowed reverse internal conversion.

Figure 1:
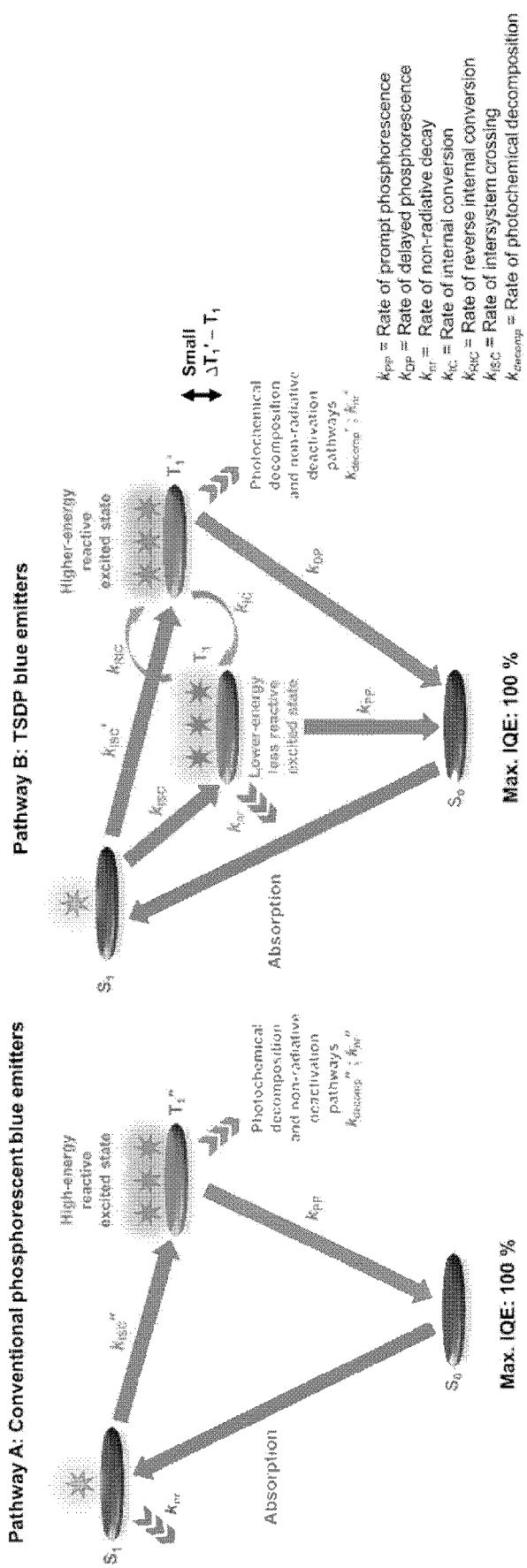
FIG. 1 presents a schematic diagram for emission processes shown by conventional phosphorescent blue emitters and TSDP blue emitters in accordance with one or more embodiments herein.

The subject matter described herein provides another possible way to achieve blue emission from higher-lying triplet-excited state(s), in which the higher-energy blue phosphorescence is achieved via a novel mechanism termed as "thermally stimulated delayed phosphorescence (TSDP)". This TSDP mechanism is unique and unprecedented but bears some similarities to that of TADF, where thermal up-conversion of excitons from lower energy excited states to higher energy excited states are observed. But instead of up-conversion via a spin-forbidden RISC from a triplet state to a singlet state, the excitons are found to be up-converted from the $T_1$ state to the second lowest-energy triplet ($T_1'$) state through the more efficient spin-allowed reverse internal conversion (RIC), as illustrated in FIG. 1. Pathway A shows how conventional phosphorescent blue emitters function, and pathway B shows how TSDP blue emitters as disclosed herein function. As the radiative decay rate of $T_1'$ excitons and the rate of RIC are distinctly higher than the radiative decay rate of $T_1$ excitons, emission is emerged from the relaxation of $T_1'$ excitons to singlet ground state ($S_0$), resulting in phosphorescence with higher energy. With this TSDP mechanism, it is possible to harvest emission from the higher energy $T_1'$ excited state, which can provide an alternative strategy towards blue emission.

Specifically, for conventional blue triplet emitters, their emissive triplet ($T_1''$) excited states are of such high energy that they are highly energetic and reactive and are more susceptible to photochemical decomposition and deactivation pathways, such as triplet-triplet annihilation, photochemical oxidative or reductive electron transfer, bond dissociation and degradation, etc. Such non-radiative photochemical decomposition and deactivation pathways not only would render the emitter a lower stability and a shorter lifetime, but also would compete with the emissive pathway, causing a decrease in the photoluminescence quantum yield (PLQY), as illustrated in pathway A of FIG. 1. The key to realizing more stable and robust, efficient blue triplet emitters is to prevent the highly reactive high-energy $T_1''$ excited state from undergoing decomposition or bond dissociation reactions. In this disclosure, we demonstrate a new concept and strategy of harvesting triplet emission via the TSDP mechanism by introducing a lower-lying less reactive lowest-energy triplet ($T_1$) excited state to act as a buffer to reduce the extent of photodecomposition and photodegradation of the blue triplet emitter. In addition, this lower-lying $T_1$ state would serve as a mediator to return the triplet excitons via upconversion by efficient spin-allowed reverse internal conversion (RIC) to the higher-lying triplet ($T_1'$) excited state that gives off the blue emission. As shown in pathway B of FIG. 1, when the excitons in $T_1'$ decay non-radiatively, the existence of a lower-lying lowest-energy triplet ($T_1$) state could act as a trap to capture the relaxed excitons through internal conversion (IC) and a mediator to return them back to $T_1'$ by upconversion through the efficient spin-allowed RIC. As the spin-allowed IC is more efficient than spin-forbidden intersystem crossing (ISC) for non-radiative decay, it is expected that the rate of IC ($k_{IC}$) is higher than that of the non-radiative decay rate of T1' ($k_{nr}'$). The excitons could be efficiently recycled instead of relaxed to ground state via non-radiative pathway, which would result in the enhancement of PLQY.

Figure 2:
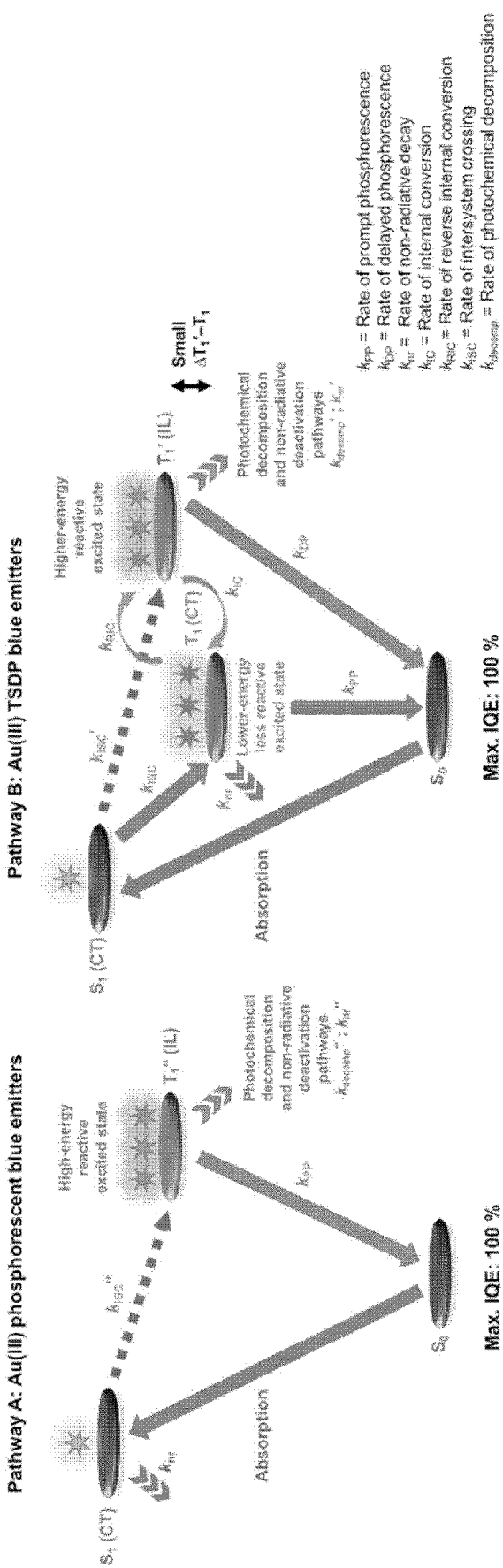
FIG. 2 presents a schematic diagram for emission processes shown by gold(III) phosphorescent blue emitters and gold(III) TSDP blue emitters in accordance with one or more embodiments herein.

Specifically, in conventional gold(III) emitters, as shown in pathway A of FIG. 2, given that the $T_1''$ and $S_1$ excited states of conventional gold(III) blue phosphorescent complexes are of rather distinct excited state nature. I In this case $T_1''$ state is of IL and $S_1$ state of CT nature, the large difference in the nature of the excited states between $S_1$ and $T_1''$ has limited the communication and coupling between the two states, leading to a rather small rate of intersystem crossing ($k_{ISC}''$) from $S_1$ to $T_1''$ state. Gold(III) TSDP emitters as disclosed herein are shown in pathway B of FIG. 2, with the presence of the lower-lying $T_1$ state of similar nature to the $S_1$ state in this novel class of gold(III) TSDP complexes, namely $T_1$ (CT) and $S_1$ (CT) states bearing similar excited state characters, the excitons could be efficiently channeled to the $T_1$ excited state by ISC and subsequently to the blue-emissive $T_1'$ state by upconversion via the more efficient spin-allowed RIC for blue light generation.

In view of these, the introduction of the lower-lying less reactive $T_1$ excited state as shown in FIG. 1 (and the specific gold(III) emitter examples in FIG. 2) not only serves to act as a buffer to minimize photodecomposition or photodegradation reactions from the more reactive higher-energy $T_1'$ emissive excited state in pathway B, but also serves as a mediator to populate the emissive $T_1'$ state by upconversion via RIC to enhance its PLQY. On the contrary, in pathway A, the absence of the less reactive, buffer and mediator triplet $T_1$ excited state with energy lower than the emissive $T_1'$ state would lead to not only a less stable blue triplet emitter but also may lead to a lower PLQY if they are of different excited state nature due to the inefficient coupling of the $S_1$ and $T_1'$ states.

The present subject matter disclosed herein makes use of this TSDP mechanism to generate a new class of highly efficient triplet emitters, as exemplified by the gold(III) complexes for the fabrication of high performance OLEDs, while at the same time improving the photostability of the blue-emitting materials by incorporating a lower-lying lowest-energy triplet state to act as a buffer to minimize photodegradation of chemical bonds.

Further disclosed herein is the concept of using efficient spin-allowed RIC to achieve TSDP, and the design, synthesis and luminescence behavior of gold(III) complexes exhibiting TSDP properties and their application as phosphorescent dopants for the fabrication of both vacuum-deposited and solution-processable OLEDs. Notably, triplet excitons are harvested with higher energy from low-energy triplet excitons by up-conversion via RIC and the TSDP mechanism. Unlike most of the other platinum(II) and gold(III) systems, the luminescent gold(III) compounds of the present disclosure are unique and attractive in that they do not show excimer emission in the solid-state thin films and no significant spectral shift is observed upon an increase in dopant concentration. This TSDP property provides a new avenue for developing robust blue-emitting gold(III) compounds. In addition, the emission color of these gold(III) complexes can be readily tuned via the variation of different strong σ-donating groups. This new concept of using efficient spin-allowed RIC to achieve TSDP generates a new class of efficient TSDP emitters with high OLED performance, while at the same time allowing the improvement of the photostability of the blue emitting materials.

The luminescent gold(III) compounds with TSDP properties have the chemical structure shown in generic formula (I) and (II),

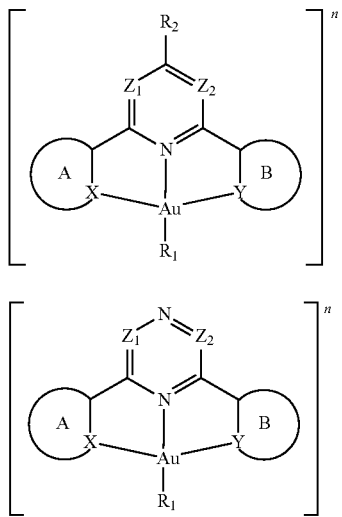

wherein:
(a) X, Y, $Z_1$ and $Z_2$ are each nitrogen or carbon;
(b) A and B are cyclic structure derivatives of unsubstituted or substituted phenyl groups or heterocyclic groups;
(c) $R_1$ is any carbon or heteroatom donor ligand, halide or pseudohalide, which could be either monoanionic or neutral. $R_1$ is selected from, but not limited to, alkyl, substituted alkyl, aryl, substituted aryl, heteroaryl, substituted heteroaryl, heterocyclic, substituted heterocyclic, alkynyl, substituted alkynyl, alkoxy, amide, thiolate, phosphide, chloride, bromide, iodide, cyanate, thiocyanate or cyanide;
(d) $R_2$ is any carbon or heteroatom ligand, halide or pseudohalide, which could be either monoanionic or neutral. $R_2$ is selected from, but not limited to, alkyl, substituted alkyl, aryl, substituted aryl, heteroaryl, substituted heteroaryl, heterocyclic, substituted heterocyclic, alkynyl, substituted alkynyl, alkoxy, amide, thiolate, phosphide, chloride, bromide, iodide, cyanate, thiocyanate or cyanide; and
(e) n is zero, a positive integer or a negative integer.

In another embodiments, in the chemical structure shown in the generic formula (I), X and Y are carbon.

In another embodiments, in the chemical structure shown in the generic formula (I), A and B are unsubstituted or substituted phenyl groups, which may be substituted by 1, 2, or 3 substituents independently selected from halogen, alkyl, alkenyl, alkynyl, alkoxy, haloalkyl, amino, nitro, hydroxyl, thio, halosulfanyl, cycloalkyl, heterocyclyl, aryl, and heteroaryl.

In another embodiments, in the chemical structure shown in the generic formula (I), $R_1$ is selected from, but not limited to, aryl, substituted aryl, heteroaryl, substituted heteroaryl, heterocyclic, substituted heterocyclic, which may be substituted by 1, 2, 3, 4, or 5 substituents independently selected from halogen, alkyl, alkenyl, alkynyl, alkoxy, haloalkyl, amino, nitro, hydroxyl, thio, halosulfanyl, cycloalkyl, heterocyclyl, aryl, and heteroaryl.

In another embodiments, in the chemical structure shown in the generic formula (I), $R_2$ is selected from, but not limited to, aryl, substituted aryl, heteroaryl, substituted heteroaryl, heterocyclic, substituted heterocyclic, which may be substituted by 1, 2, or 3 substituents independently selected from halogen, alkyl, alkenyl, alkynyl, alkoxy, haloalkyl, amino, nitro, hydroxyl, thio, halosulfanyl, cycloalkyl, heterocyclyl, aryl, and heteroaryl.

In one or more embodiments, rings A and B are independently benzene, pyridine, phenyl and pyridyl derivatives, heterocycle or heterocyclic derivatives, but are not limited to, with one or more alkyl, alkenyl, alkynyl, aryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkenyl, alkynyl, alkyaryl, aryl, or cycloalkyl.

Definitions

In the present disclosure the following terms are used.

The term "halo", "halogen" or "halide" as used herein includes fluorine, chlorine, bromine and iodine.

The term "pseudohalide" as used herein includes, but not limited to, cyanate, thiocyanate and cyanide.

The term "alkyl" as used herein includes straight and branched chain alkyl groups, as well as cycloalkyl groups with alkyl groups having a cyclic structure. Preferred alkyl groups are those containing between one to eighteen carbon atoms (such as between one to twelve carbon atoms, between one to eight carbon atoms, or between one to six carbon atoms) and includes methyl, ethyl, propyl, isopropyl, butyl, isobutyl, tert-butyl, and other similar compounds. In addition, the alkyl group may be optionally substituted with one or more substituents selected from OR, $NR_2$, SR, C(O)R, C(O)OR, C(O)$NR_2$, CN, $CF_3$, $NO_2$, $SO_2$, SOR, $SO_3R$, halo and cyclic-amino, wherein R is independently alkyl, alkenyl, alkynyl, alkyaryl, aryl, or cycloalkyl.

The term "alkenyl" as used herein includes both straight and branched chain alkene radicals. Preferred alkenyl groups are those containing between two and eighteen carbon atoms (such as between two to twelve carbon atoms, between two to eight carbon atoms, or between two to six carbon atoms). In addition, the alkenyl group may be optionally substituted with one or more substituents selected from OR, $NR_2$, SR, C(O)R, C(O)OR, C(O)$NR_2$, CN, $CF_3$, $NO_2$, $SO_2$, SOR, $SO_3R$, halo and cyclic-amino, wherein R is independently alkyl, alkenyl, alkynyl, alkyaryl, aryl, or cycloalkyl.

The term "alkynyl" as used herein includes both straight and branched chain alkyne radicals. Preferred alkynyl groups are those containing between two and eighteen carbon atoms (such as between two to twelve carbon atoms, between two to eight carbon atoms, or between two to six carbon atoms). In addition, the alkynyl group may be optionally substituted with one or more substituents selected from OR, $NR_2$, SR, C(O)R, C(O)OR, C(O)$NR_2$, CN, $CF_3$, $NO_2$, $SO_2$, SOR, $SO_3R$, halo and cyclic-amino, wherein R is independently alkyl, alkenyl, alkynyl, alkyaryl, aryl, or cycloalkyl.

"Alkoxy" refers to the group —OR wherein R is a substituted or unsubstituted alkyl as defined herein.

"Haloalkyl" refers to the above defined "alkyl", which is substituted by one or more halo groups.

"Halosulfanyl" refers to a sulfanyl substituted by one or more halo groups, which includes —$SF_5$.

"Cycloalkyl" refers to a radical of a non-aromatic cyclic hydrocarbon group having from 3 to 8 ring carbon atoms and zero heteroatoms.

The term "arylalkynyl" as used herein includes an alkynyl group which has an aromatic group as a substituent. In addition, the arylalkynyl group may be optionally substituted with one or more substituents selected from OR, NR$_2$, SR, C(O)R, C(O)OR, C(O)NR$_2$, CN, CF$_3$, NO$_2$, SO$_2$, SOR, SO$_3$R, halo and cyclic-amino, wherein R is independently alkyl, alkenyl, alkynyl, alkyaryl, aryl, or cycloalkyl.

The term "alkylaryl" as used herein includes an aryl group which has an alkyl group as a substituent. In addition, the alkylaryl group may be optionally substituted with one or more substituents selected from OR, NR$_2$, SR, C(O)R, C(O)OR, C(O)NR$_2$, CN, CF$_3$, NO$_2$, SO$_2$, SOR, SO$_3$R, halo and cyclic-amino, wherein R is independently alkyl, alkenyl, alkynyl, alkyaryl, aryl, or cycloalkyl.

The term "alkenylaryl" as used herein includes an aryl group which has an alkenyl group as a substituent. In addition, the alkenylaryl group may be optionally substituted with one or more substituents selected from OR, NR$_2$, SR, C(O)R, C(O)OR, C(O)NR$_2$, CN, CF$_3$, NO$_2$, SO$_2$, SOR, SO$_3$R, halo and cyclic-amino, wherein R is independently alkyl, alkenyl, alkynyl, alkyaryl, aryl, or cycloalkyl.

The term "arylalkenyl" as used herein includes an aryl group which has an alkenyl unit as the point of attachment to the gold(III) metal center. In addition, the arylalkenyl group may be optionally substituted with one or more substituents selected from OR, NR$_2$, SR, C(O)R, C(O)OR, C(O)NR$_2$, CN, CF$_3$, NO$_2$, SO$_2$, SOR, SO$_3$R, halo and cyclic-amino, wherein R is independently alkyl, alkenyl, alkynyl, alkyaryl, aryl, or cycloalkyl.

Aryl alone or in combination includes carbocyclic aromatic systems containing between six to eighteen carbon atoms (such as between six to twelve carbon atoms, between six to ten carbon atoms, or six carbon atoms). The systems may contain one, two or three rings wherein each ring may be attached together in a pendant manner or may be fused. Preferably the rings are 5- or 6-membered rings, such as phenyl. In one embodiment, the term substitute aryl includes substituted sulfanyl, In one embodiment, substituted sulfanyl includes pentafluorosulfanyl.

Heteroaryl alone or in combination includes heterocyclic aromatic systems containing between six to eighteen carbon atoms (such as between six to twelve carbon atoms, between six to ten carbon atoms, or six carbon atoms) and one to four heteroatoms independently selected from nitrogen, oxygen, and sulfur. The systems may contain one, two or three rings wherein each ring may be attached together in a pendant manner or may be fused. Preferably the rings are 5- or 6-membered rings.

Heterocyclic and heterocycle refer to a 3 to 7-membered ring containing at least one heteroatom. This includes aromatic rings including but not limited to pyridine, thiophene, furan, pyrazole, imidazole, oxazole, isoxazole, thiazole, isothiazole, pyrrole, pyrazine, pyridazine, pyrimidine, benzimidazole, benzofuran, benzothiazole, indole, naphthalene, triazole, tetrazole, pyran, thiapyran, oxadiazole, triazine, tetrazine, carbazole, dibenzothiophene, dibenzofuran, fluorine, and non-aromatic rings including but not limited to piperazine, piperidine, and pyrrolidine. The groups of the present disclosure can be substituted or unsubstituted. Preferred substituents include but are not limited to alkyl, alkoxy, aryl.

Heteroatom refers to S, O, N, P, Se, Te, As, Sb, Bi, B, Si and Ge.

Substituted refers to any level of substitution although mono-, di- and tri-substitutions are preferred. Preferred substituents include hydrogen, halogen, aryl, alkyl, alkenyl, alkynyl, alkoxy, haloalkyl, amino, nitro, hydroxyl, thio, halosulfanyl, cycloalkyl, heterocyclyl, aryl, and heteroaryl.

Cyclometalating ligand is a term well known in the art and includes but is not limited to 2,6-diphenylpyridine (C^N^C), 2,6-bis(4-tert-butylphenyl)pyridine ($^t$BuC^N^C$^t$Bu), 2,6-diphenyl-4-(2,5-difluorophenyl)pyridine (2,5-F$_2$—C$_6$H$_3$-C^N^C), 2,6-diphenyl-4-p-tolylpyridine (C^NTol^C), 2,6-diphenyl-4-phenylpyridine (C^NPh^C), 2,6-bis(4-fluorophenyl)pyridine (FC^N^CF), 2,6-diphenyl-4-(4-isopropylphenyl)pyridine (4-$^i$Pr-Ph-C^N^C), 2,6-diphenyl-4-(4-nitrophenyl)pyridine (4-NO$_2$-Ph-C^N^C), 2,6-diphenyl-4-(4-methoxyphenyl)pyridine (4-OMe-Ph-C^N^C), 2,6-diphenyl-4-(4-methylphenyl)pyridine (4-Me-Ph-C^N^C), 2,6-diphenyl-4-(4-ethylphenyl)-pyridine (4-Et-Ph-C^N^C), 2,6-diphenyl-4-(2,3,4-trimethoxyphenyl)pyridine (2,3,4-OMe$_3$-Ph-C^N^C), 2,6-bis(4-methoxyphenyl)-4-(4-nitrophenyl)pyridine (4-NO$_2$-Ph-MeOC^N^-COMe), 2,6-bis(2,4-dichlorophenyl)-4-(4-isopropylphenyl)-pyridine (4-$^i$Pr-Ph-C$_2$C^N^CC$_{12}$), 2,6-diphenyl-4-(4-tosylphenyl)pyridine (4-OTs-Ph-C^N^C), 2,6-diphenyl-4-(4-dimethylaminophenyl)pyridine (4-NMe$_2$-Ph-C^N^C), 2,6-diphenyl-4-(4-diphenylaminophenyl)pyridine (4-NPh$_2$-Ph-C^N^C), 2,6-diphenyl-4-(4-bromophenyl)pyridine (4-Br-Ph-C^N^C), 2,6-diphenyl-4-(4-chlorophenyl)pyridine (4-Cl-Ph-C^N^C), 2,6-diphenyl-4-(4-flurophenyl)pyridine (4-F-Ph-C^N^C), 2,6-diphenyl-4-(4-iodophenyl)pyridine (4-I-Ph-C^N^C), 2,6-diphenyl-4-(2,5-dimethylphenyl)pyridine (2,5-Me$_2$-Ph-C^N^C), 2,6-diphenyl-4-(2,3,4,5,6-pentafluorophenyl)pyridine (2,3,4,5,6-F$_5$-Ph-C^N^C), 1,3-diphenylisoquinoline (dpiq), 2,4,6-triphenyl-1,3,5-triazine (C^N$^{TRZ}$^C), 2,4,6-tris(4-(tert-butyl)phenyl)-1,3,5-triazine ($^t$BuC^N$^{TRZ}$(C$_6$H$_4$-$^t$Bu)^C$^t$Bu).

Benzene includes substituted or unsubstituted benzene.
Pyridine includes substituted or unsubstituted pyridine.
Thiophene includes substituted or unsubstituted thiophene.
Furan includes substituted or unsubstituted furan.
Pyrazole includes substituted or unsubstituted pyrazole.
Imidazole includes substituted or unsubstituted imidazole.
Oxazole includes substituted or unsubstituted oxazole.
Isoxazole includes substituted or unsubstituted isoxazole.
Thiazole includes substituted or unsubstituted thiazole.
Isothiazole includes substituted or unsubstituted isothiazole.
Pyrrole includes substituted or unsubstituted pyrrole.
Pyrazine includes substituted or unsubstituted pyrazine.
Pyridazine includes substituted or unsubstituted pyridazine.
Pyrimidine includes substituted or unsubstituted pyrimidine.
Benzimidazole includes substituted or unsubstituted benzimidazole.
Benzofuran includes substituted or unsubstituted benzofuran.
Benzothiazole includes substituted or unsubstituted benzothiazole.
Indole includes substituted or unsubstituted indole.
Naphthalene includes substituted or unsubstituted naphthalene.
Triazole includes substituted or unsubstituted triazole.
Tetrazole includes substituted or unsubstituted tetrazole.
Pyran includes substituted or unsubstituted pyran.
Thiapyran includes substituted or unsubstituted thiapyran.

Oxadiazole includes substituted or unsubstituted oxadiazole.

Triazine includes substituted or unsubstituted triazine.

Tetrazine includes substituted or unsubstituted tetrazine.

Carbazole includes substituted or unsubstituted carbazole.

Dibenzothiophene includes substituted or unsubstituted dibenzothiophene.

Dibenzofuran includes substituted or unsubstituted dibenzofuran.

Piperazine includes substituted or unsubstituted piperazine.

Piperidine includes substituted or unsubstituted piperidine.

Pyrrolidine includes substituted or unsubstituted pyrrolidine.

In some embodiments, the luminescent gold(III) compounds of general structures (I) are prepared in high purity. The compounds described have been represented throughout by their monomeric structure. As is well known to those skilled in the art, the compounds may also be present as dimers, trimers or dendrimers.

While the gold(III) compounds described herein are described with use in OLEDs, the compounds have additional applications as would be understood to those who are skilled in the art. The gold(III) compounds described herein have strong light emitting and light absorption properties that make them suitable for inclusion into common apparatuses for which light emission or absorption are desired. For example, the gold(III) compounds may be used as, but are not limited to, the backlighting of flat panel displays of wall-mounted televisions, copiers, printers, liquid crystal displays, measuring instruments, display boards, marker lamps, electrophotographic photoreceptors, photoelectric transducers, solar cells and image sensors.

The luminescent gold(III) compounds can be used to form thin films by vacuum deposition, spin-coating, ink-jet printing or other known fabrication methods and be applied in OLEDs. A typical OLED has, in order, substrate, hole-injecting anode, hole transporting layer, light-emitting layer, electron transporting layer, and electron-injecting cathode. In general, the emissive layer is sandwiched between the hole-transporting layer and the electron-transporting layer. To ensure an efficient exothermic energy transfer between the host material and the dopant material, the triplet energy of the host material must be larger than that of the dopant material. In addition, both the ionization potential and the electron affinity of the host material should be larger than those of the dopant material in order to achieve efficient Forster energy transfer from the host to the dopant. In order to confine triplet excitons within the emissive layer, the triplet energy of the hole-transporting material and electron-transporting material should be larger than that of the dopant material.

Figure 3:
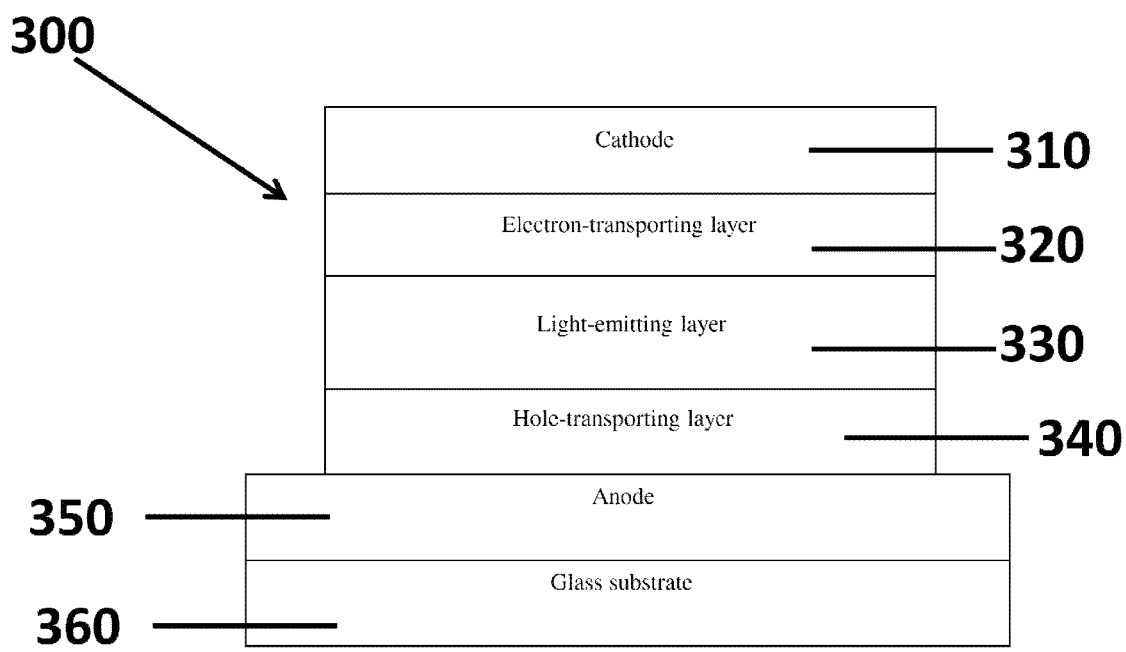
FIG. 3 is a schematic diagram of the basic structure of an OLED, in accordance with one or more embodiments herein.

With reference now to FIG. 3, the gold(III) compounds as in one or more embodiments herein can be fashioned into an OLED structure 100. The OLED structure 300 includes a cathode 310, an electron transport layer 320 ("ETL"), a light-emitting layer 330 (or "emissive layer"), a hole-transporting layer 340 ("HTL"), an anode 350, and a substrate 360. The light-emitting layer 330 includes a luminescent gold(III) compound as described herein. Although not shown in FIG. 3, in one or more embodiments OLED 300 further includes a hole blocking layer and/or a carrier confinement layer to improve the device performance. Device structures with modifications to include various carrier blocking layers, carrier injection layers and interlayers can also be used to improve the device performance.

The cathode 310 and anode 350 are a pair of electrodes sandwiching these plurality of semiconductor layers that cause EL when voltage is applied to the OLED 300.

The cathode 310 acts as a transmissive electron injector that injects electrons into the organic emissive layer 130 when the cathode is negatively biased. The cathode comprises a thin fluoride layer (which may be omitted) and a metal or metal alloy, preferably having a work function of less than 4 eV The cathode 310 may be made of suitable materials such as, for example, Mg:Ag, Ca, Li:Al, Al, or Ba. The anode 350 injects holes into the emissive layer when the anode is positively biased. The anode 350 is composed of a conductive and optionally transmissive layer. In one or more embodiments, viewing the emissive layer 130 through the substrate 360 is desirable, and the anode is transparent. In other embodiments, the emissive layer 130 is viewed through the top electrode and the transmissive characteristics of anode 350 are immaterial, and therefore any appropriate materials including metals or metal compounds having a work function of greater than 4.1 eV may be used. For example, appropriate metals include silver, gold, iridium, nickel, molybdenum, palladium, and platinum. In one or more embodiments, the anode 350 is transmissive, and suitable materials are metal oxides, including indium-tin oxide, aluminum- or indium-doped zinc oxide, tin oxide, magnesium-indium oxide, nickel-tungsten oxide, and cadmium-tin oxide. The preferred metals and metal oxides can be deposited by evaporation, sputtering, laser ablation, and chemical vapor deposition. The cathode 310 and anode 350 can have thicknesses between 100-200 nm.

In one or more embodiments, the anode 350 layer is positioned on top of a substrate 360. The substrate 360 is electrically insulated and is used to emit the light created by the OLED 300, in which it is typically made of optically transparent material. For example, the substrate 360 can be made of glass, plastic foil, or a transparent polymer. In one or more alternative embodiments, the substrate is opaque and comprises one or more semiconducting materials or ceramics. In one embodiment, the emissive layer 330 is viewed through the substrate 360, or through both sides of the device, and substrate comprises a transparent glass substrate or a plastic foil. In other embodiments, the emissive layer 330 is viewed only through the top electrode, and substrate 360 comprises an opaque semiconductor or ceramic wafers.

The ETL 320 provides high electron affinity and high electron mobility to the OLED 300 for electrons to flow across the various OLED layers. To do this, the electron-transporting layer 120 includes materials or mixtures of materials having a high ionization potential and wide optical band gap. In one or more embodiments, the ETL 320 has a thickness between 30-80 nm. In one or more embodiments, additional electron transporting materials are added to ETL 320 to facilitate electron emission. The materials for the ETL 320 are selected to maximize OLED efficiency. As some non-limiting examples, suitable electron-transporting materials include but not limited to 1,3,5-tris(phenyl-2-benzimidazolyl)-benzene (TPBI), 1,3,5-tri[(3-pyridyl)-phen-3-yl] benzene (TmPyPB), bathocuproine (BCP), bathophenanthroline (BPhen) and bis(2-methyl-8-quinolinolate)-4-(phenylphenolate)aluminum (BAlq), tris-[2,4,6-trimethyl-3-(pyridin-3-yl)phenyl]borane (3TPYMB), and 1,3-bis[3,5-di(pyridin-3-yl)phenyl]benzene (BmPyPhB). In one embodiment, the electron-transporting layer 120 is prepared as an organic film by thermal evaporation, spin-coating, ink-jet printing from a solution, or other known fabrication methods.

Light-emitting layer or emissive layer 330 in FIG. 3 is formed by doping the phosphorescent gold(III) metal complex as a dopant into a host material. Suitable host materials should be selected so that the triplet excitons can be transferred efficiently from the host material to the phosphorescent dopant material. Suitable host materials include, but not limited to, certain aryl amines, triazoles and carbazole compounds. Examples of desirable hosts are but not limited to 4,4'-bis(carbazol-9-yl)biphenyl (CBP), MCP, TCTA, 3-(4-biphenylyl)-4-phenyl-5-tert-butylphenyl-1,2,butylphenyl-1,2,4-triazole (TAZ), p-bis(triphenylsilyl)benzene (UGH2), and PVK.

In general, the emissive layer 330 is sandwiched between the hole-transporting layer 340 and the electron-transporting layer 320. To ensure an efficient exothermic energy transfer between the host material and the dopant material, the triplet energy of the host material must be larger than that of the dopant material. In addition, both the ionization potential and the electron affinity of the host material should be larger than those of the dopant material in order to achieve efficient Forster energy transfer from the host to the dopant. In order to confine triplet excitons within the emissive layer, the triplet energy of the hole-transporting material and electron-transporting material should be larger than that of the dopant material.

The HTL 340 is layered on top of the anode 350 and plays a role in the adjustment of electron/hole injection to attain transport balance of charge carriers in the emissive layer 130 of the OLED 300. In one or more embodiments, the HTL 340 has a thickness between 30-80 nm. The materials for the HTL 340 are selected to maximize OLED efficiency. As some non-limiting examples, the HTL 340 can include, but not limited to, polycyclic aromatic compounds, for example, 4,4'-bis[N-(1-naphthyl)-N-phenylamino]biphenyl(NPB),4, 4'-bis[N-(3-methylphenyl)-N-phenylamino]biphenyl(TPD), 4,4',4'-tris[(3-methylphenyl)phenylamino] triphenylamine (MTDATA), and di-[4-(N,N-ditolyl-amino)phenyl]cyclohexane (TAPC). In addition, polymeric hole-transporting materials can be used including PVK, polythiophene, polypyrrole, polyaniline, and copolymers including poly(3,4-ethylenedioxythiophene):poly(styrene-sulfonate) (PEDOT: PSS).

In some embodiments, novel luminescent gold(III) compounds are either the primary luminescent material or a secondary luminescent material in device. In some embodiments, the gold(III) compounds are employed as electrophosphorescent dopants in multilayer OLEDs with EQEs of up to 7.7%. The novel TSDP mechanism disclosed herein allows thermal up-conversion of triplet excitons, generating blue emission having high color purity. In addition, the gold(III) compounds disclosed herein can be deposited to form thin films by either vacuum deposition, spin-coating, screen printing or ink-jet printing. Their high solubilities in a variety of organic solvents also permits simple and economic manufacturing and patterning of large-area displays.

The present disclosure will be illustrated more specifically by the following non-limiting examples, it being understood that changes and variations can be made therein without deviating from the scope and the spirit of the disclosure as hereinafter claimed. It is also understood that various theories as to why the disclosure works are not intended to be limiting.

Figure 4:
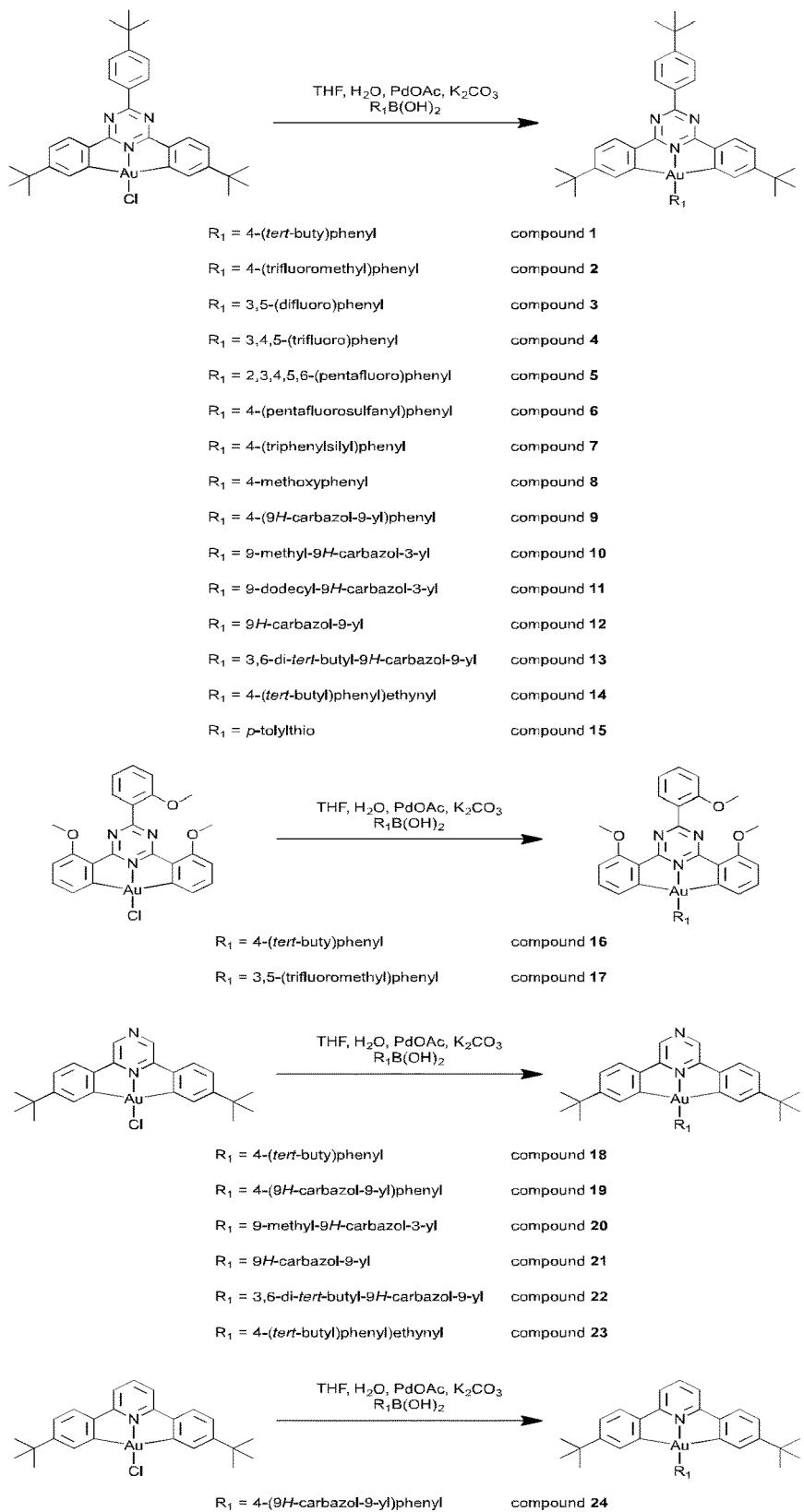
FIG. 4 shows the chemical structures of exemplary compounds 1-24 as disclosed herein.

Throughout the following examples, reference is made to FIG. 4, which discloses the chemical structure of a series of compounds that form the basis of the examples, namely compounds 1-24. The chemical structure of compounds 1-17 is shown as through the representative reaction at the top portion of FIG. 4 and the list of elements that are substituted in as $R_1$ below them (e.g., $R_1$ is 4-(tert-buty) phenyl for compound 1, $R_1$ is 4-(trifuoromethyl)phenyl for compound 2, etc.). Similarly, the chemical structure of compounds 18-23 are shown as through the representative reaction at the middle portion of FIG. 4 and the chemical structure of compound 24 is shown as through the representative reaction at the bottom portion of FIG. 4, the list of elements that are substituted in as $R_1$ below them.

Example 1

General Synthetic Methodology:

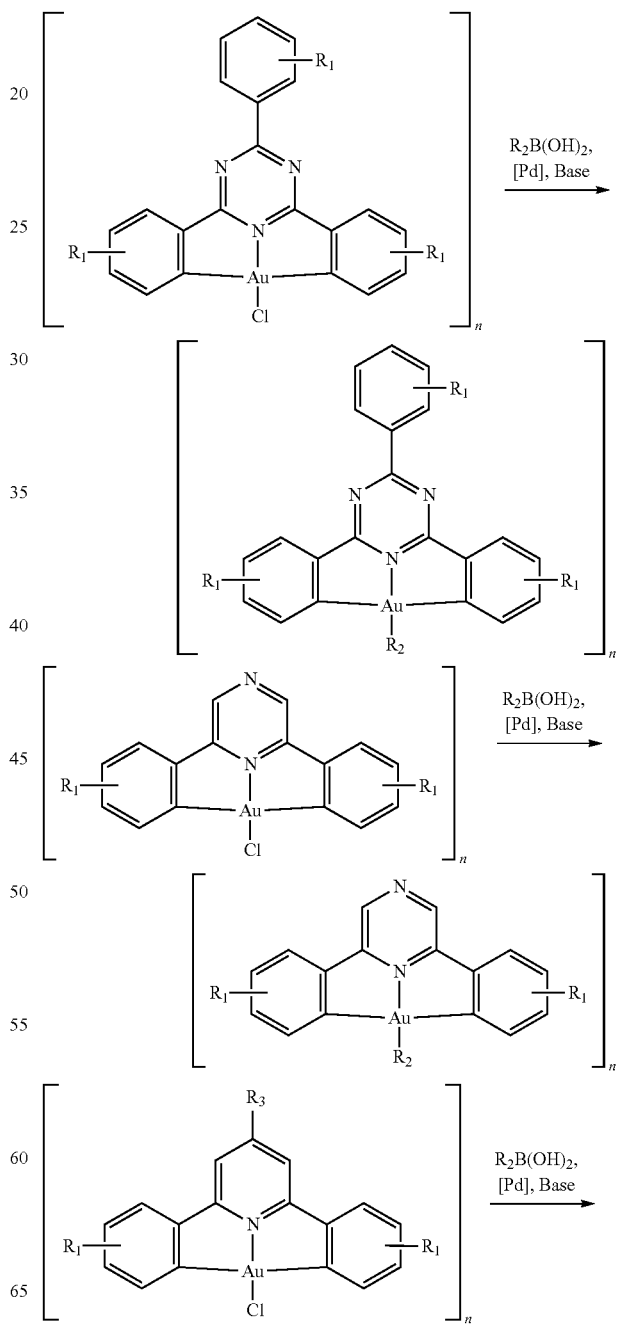

-continued

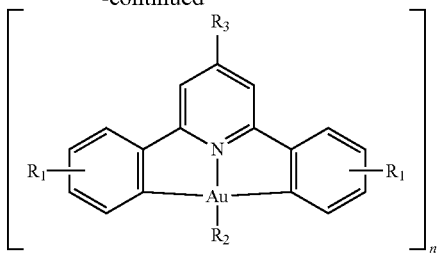

wherein:
(a) R₁ and R₃ are selected from, but are not limited to, alkyl, alkenyl, alkynyl, alkylaryl, aryl and cycloalkyl with one or more alkyl, alkenyl, alkynyl, alkylaryl, cycloalkyl, OR, NR$_2$, SR, C(O)R, C(O)OR, C(O)NR$_2$, CN, CF$_3$, NO$_2$, SO$_2$, SOR, SO$_3$R, halo, aryl, substituted aryl, heteroaryl, substituted heteroaryl or a heterocyclic group, wherein R is independently alkyl, alkynyl, alkylaryl, aryl or cycloalkyl. R₁ could also be heteroatom and is selected from, but not limited to, nitrogen, oxygen, sulphur or phosphorus;
(b) R₂ is selected from, but is not limited to, alkyl, substituted alkyl, aryl, substituted aryl, heteroaryl, substituted heteroaryl, heterocyclic, substituted heterocyclic, alkynyl or substituted alkynyl; and
(c) n is zero, a positive integer or a negative integer.

Synthesis and Characterization:

The tridentate ligand, 2,4,6-tris(4-(tert-butyl)phenyl)-1,3,5-triazine, 2,4,6-tris(2-methoxyphenyl)-1,3,5-triazine, 2,6-bis(4-(tert-butyl)phenyl)pyrazine and 2,6-bis(4-(tert-butyl)phenyl)pyridine, and the precursor compound, [Au{$^t$BuC^N$^{TRZ}$(C$_6$H$_4$-$^t$Bu)^C$^t$Bu}Cl], [Au{(2-MeO)-C^N-$^{TRZ}$(C$_6$H$_4$-2-OMe)^C-(2-OMe)}Cl], [Au{$^t$BuC^N$^{PZ}$^C$^t$Bu}Cl] and [Au{$^t$BuC^N^C$^t$Bu}Cl] were prepared according to modification of procedures reported in the literature [Wong, K.-H.; Cheung, K.-K.; Chan, M. C.-W.; Che, C.-M. *Organometallics* 17, 3505 (1998); Tanaka, H.; Shizu, K.; Nakanotani, H.; Adachi, C. *J. Phys. Chem. C* 118, 15985 (2014)]. The target compounds were synthesized according to a procedure reported in the literature with modification [Tang, M.-C.; Lee, C.-H.; Lai, S.-L.; Ng, M.; Chan, M.-Y.; Yam, V. W.-W. *J. Am. Chem. Soc.* 139, 9341 (2017)]. For example, compound 1 was synthesized by stirring a mixture of [Au{$^t$BuC^N$^{TRZ}$(C$_6$H$_4$-$^t$Bu)^C$^t$Bu}Cl] (200 mg, 0.28 mmol), K$_2$CO$_3$ (276 mg, 2.0 mmol), Pd(OAc)$_2$ (6 mg, 0.028 mmol), [HP($^t$Bu)$_3$]BF$_4$ (16 mg, 0.056 mmol), and the corresponding boronic acid (0.56 mmol) in degassed tetrahydrofuran-H$_2$O (45 mL, 8:1, v/v) at 80° C. for 12 h under a nitrogen atmosphere, followed by column chromatography to yield a yellow solid. The product was further purified by dissolving in dichloromethane and layering with methanol. The solid was filtered and dried under vacuum to give a yellow solid (152 mg). Compounds 2-24 were synthesized using similar procedure as compound 1.

$^1$H NMR spectra were recorded on a Bruker AVANCE 500 or 600 (500 MHz, 600 MHz) Fourier-transform NMR spectrometer with chemical shifts reported relative to tetramethylsilane (δ 0 ppm). $^{19}$F{$^1$H}NMR spectra were recorded on a Bruker AVANCE 400 (162 MHz) Fourier-transform NMR spectrometer with chemical shifts reported relative to trifluoroacetic acid (δ=−76.55 ppm) in chloroform. The results of the analyses confirm the high purity of compounds 1-24.

The characterization data of compounds 1-24 are as set forth in the subsequent paragraphs.

Compound 1: [Au{$^t$BuC^N$^{TRZ}$(C$_6$H$_4$-$^t$Bu)^C$^t$Bu}(C$_6$H$_4$-$^t$Bu-4)]. Yield: 152 mg, 67%. $^1$H NMR (500 MHz, CDCl$_3$, 298 K, relative to Me$_4$Si, δ/ppm): δ 8.68 (d, J=8.5 Hz, 2H), 8.20 (d, J=8.0 Hz, 2H), 7.75 (d, J=2.0 Hz, 2H), 7.66 (d, J=8.0 Hz, 2H), 7.62 (d, J=8.5 Hz, 2H), 7.42 (dd, J=8.5, 2.0 Hz, 2H), 7.39 (d, J=8.5 Hz, 2H), 1.41 (s, 18H), 1.32 (s, 18H). HRMS (positive ESI) found 806.3783 [M+H]$^+$; calcd for C$_{43}$H$_5$ON$_3$Au (m/z) 806.3743.

Compound 2: [Au{$^t$BuC^N$^{TRZ}$(C$_6$H$_4$-$^t$Bu)^C$^t$Bu}(C$_6$H$_4$—CF$_3$-4)]. Yield: 143 mg, 62%. $^1$H NMR (600 MHz, CDCl$_3$, 298 K, relative to Me$_4$Si, δ/ppm): δ 8.68 (d, J=8.4 Hz, 2H), 8.19 (d, J=8.1 Hz, 2H), 7.84 (d, J=7.9 Hz, 2H), 7.63 (d, J=8.4 Hz, 2H), 7.59 (d, J=8.1 Hz, 2H), 7.56 (d, J=1.6 Hz, 2H), 7.43 (dd, J=8.1, 1.6 Hz, 2H), 1.42 (s, 9H), 1.30 (s, 18H). $^{19}$F{$^1$H} NMR (376 MHz, CDCl$_3$, 298 K, relative to CF$_3$COOH, δ/ppm) δ 61.95. HRMS (positive ESI) found 818.2961 [M+H]$^+$; calcd for C$_{40}$H$_{41}$AuF$_3$N$_3$ (m/z) 818.2991.

Compound 3: [Au{$^t$BuC^N$^{TRZ}$(C$_6$H$_4$-$^t$Bu)^C$^t$Bu}(C$_6$H$_3$—F$_2$-3,5)]. Yield: 135 mg, 61%. $^1$H NMR (600 MHz, CDCl$_3$, 298 K, relative to Me$_4$Si, δ/ppm): δ 8.67 (d, J=8.5 Hz, 2H), 8.18 (d, J=8.2 Hz, 2H), 7.62 (d, J=8.5 Hz, 2H), 7.60 (d, J=1.8 Hz, 2H), 7.44 (dd, J=8.2, 1.8 Hz, 2H), 7.26-7.27 (m, 2H), 6.72-6.76 (m, 2H), 1.42 (s, 9H), 1.32 (m, 18H). $^{19}$F{$^1$H} NMR (376 MHz, CDCl$_3$, 298 K, relative to CF$_3$COOH, δ/ppm) δ 108.73. HRMS (positive ESI) found 786.2902 [M+H]$^+$; calcd for C$_{39}$H$_{40}$AuF$_2$N$_3$ (m/z) 786.2929.

Compound 4: [Au{$^t$BuC^N$^{TRZ}$(C$_6$H$_4$-$^t$Bu)^C$^t$Bu}(C$_6$H$_2$—F$_3$-3,4,5)]. Yield: 115 mg, 51%. $^1$H NMR (600 MHz, CDCl$_3$, 298 K, relative to Me$_4$Si, δ/ppm): δ 8.68 (d, J=10.2 Hz, 2H), 8.19 (d, J=10.2 Hz, 2H), 7.63 (d, J=10.2 Hz, 2H), 7.57 (d, J=1.8 Hz, 2H), 7.45 (dd, J=10.2, 1.8 Hz, 2H), 7.35 (d, J=9 Hz, 2H), 1.42 (s, 9H), 1.33 (s, 18H). $^{19}$F{$^1$H} NMR (376 MHz, CDCl$_3$, 298 K, relative to CF$_3$COOH, δ/ppm) δ 166.43, 137.60. HRMS (positive ESI) found 804.2822 [M+H]$^+$; calcd for C$_{39}$H$_{39}$AuF$_3$N$_3$ (m/z) 804.2835.

Compound 5: [Au{$^t$BuC^N$^{TRZ}$(C$_6$H$_4$-$^t$Bu)^C$^t$Bu}(C$_6$F$_5$)]. Yield: 113 mg, 48%. $^1$H NMR (600 MHz, CDCl$_3$, 298 K, relative to Me$_4$Si, δ/ppm): δ 8.68 (d, J=10.2 Hz, 2H), 8.17 (d, J=9.6 Hz, 2H), 7.63 (d, J=10.2 Hz, 2H), 7.44 (dd, J=1.8, 10.2 Hz, 2H), 7.39 (dd, J=1.8, 9.6 Hz, 2H), 1.42 (s, 9H), 1.29 (s, 18H). $^{19}$F{$^1$H} NMR (376 MHz, CDCl$_3$, 298 K, relative to CF$_3$COOH, δ/ppm) δ 162.06, 158.17, 119.12. HRMS (positive ESI) found 840.2633 [M+H]$^+$; calcd for C$_{39}$H$_{37}$AuF$_5$N$_3$ (m/z) 840.2646.

Compound 6: [Au{$^t$BuC^N$^{TRZ}$(C$_6$H$_4$-$^t$Bu)^C$^t$Bu}(C$_6$H$_4$—SF$_5$-4)]. Yield: 132 mg, 54%. $^1$H NMR (600 MHz, CDCl$_3$, 298 K, relative to Me$_4$Si, δ/ppm): δ 8.68 (d, J=10.2 Hz, 2H), 8.20 (d, J=9.8 Hz, 2H), 7.82 (d, J=9.8 Hz, 2H), 7.72 (d, J=10.4 Hz, 2H), 7.63 (d, J=10.2 Hz, 2H), 7.53 (d, J=2.2 Hz, 2H), 7.44 (dd, J=2.2, 10.4 Hz, 2H), 1.42 (s, 9H), 1.30 (s, 18H). HRMS (positive ESI) found 876.2646 [M+H]$^+$; calcd for C$_{39}$H$_{41}$AuF$_5$N$_3$S (m/z) 876.2680.

Compound 7: [Au{$^t$BuC^N$^{TRZ}$(C$_6$H$_4$-$^t$Bu)^C$^t$Bu}{C$_6$H$_4$—S$_1$—(C$_6$H$_5$)$_4$-4}]. Yield: 138 mg, 49%. $^1$H NMR (500 MHz, CDCl$_3$, 298 K, relative to Me$_4$Si, δ/ppm): δ 8.68 (d, J=8.5 Hz, 2H), 8.20 (d, J=8.2 Hz, 2H), 7.75 (d, J=7.7 Hz, 2H), 7.61-7.70 (m, 8H), 7.54 (d, J=7.7 Hz, 2H), 7.39-7.47 (m, 13H), 1.41 (s, 9H), 1.32 (s, 18H).

Compound 8: [Au{$^t$BuC^N$^{TRZ}$(C$_6$H$_4$-$^t$Bu)^C$^t$Bu}(C$_6$H$_4$—OCH$_3$-4)]. Yield: 115 mg, 51%. $^1$H NMR (500 MHz, CDCl$_3$, 298 K, relative to Me$_4$Si, δ/ppm): δ 8.68 (d, J=8.6 Hz, 2H), 8.20 (d, J=8.1 Hz, 2H), 7.73 (d, J=1.9 Hz, 2H), 7.66 (d, J=8.7 Hz, 2H), 7.62 (d, J=8.6 Hz, 2H), 7.43 (d, J=8.2 Hz, 2H), 6.97 (d, J=8.7 Hz, 2H), 3.9 (s, 3H), 1.41 (s, 9H), 1.32 (s, 18H). HRMS (positive ESI) found 708.3217 [M+H]$^+$; calcd for $C_{51}H_{49}AuN_4$ (m/z) 780.3222.

Compound 9: [Au{$^t$BuC^N$^{TRZ}$(C$_6$H$_4$-$^t$Bu)^C$^t$Bu}(C$_6$H$_4$-9H-cbz-4)]. Yield: 73 mg, 31%. $^1$H NMR (500 MHz, CDCl$_3$, 298 K, relative to Me$_4$Si, δ/ppm): δ 8.71 (d, J=6.5 Hz, 2H), 8.25 (d, J=8.0 Hz, 2H), 8.20 (d, J=7.5 Hz, 2H), 7.99 (d, J=8.5 Hz, 2H), 7.78 (d, J=2.0 Hz, 2H), 7.65 (d, J=8.5 Hz, 2H), 7.58 (t, J=8.5 Hz, 2H), 7.44-7.48 (m, 4H), 7.30-7.33 (m, 2H), 1.43 (s, 9H), 1.35 (s, 18H). HRMS (positive ESI) found 915.3667 [M+H]$^+$; calcd for $C_{51}H_{49}AuN_4$ (m/z) 915.3696.

Compound 10: [Au{$^t$BuC^N$^{TRZ}$(C$_6$H$_4$-$^t$Bu)^C$^t$Bu}(3-9H-cbz-CH$_3$-9)]. Yield: 143 mg, 60%. $^1$H NMR (600 MHz, CDCl$_3$, 298 K, relative to Me$_4$Si, δ/ppm): δ 8.70 (d, J=10.2 Hz, 2H), 8.38 (s, 1H), 8.24 (d, J=9.6 Hz, 2H), 8.08 (d, J=9.6 Hz, 1H), 7.90 (d, J=10.2 Hz, 1H), 7.84 (d, J=1.8 Hz, 1H), 7.63 (d, J=10.2 Hz, 2H), 7.50-7.42 (m, 5H), 7.26-7.20 (m, 2H), 1.42 (s, 9H), 1.28 (s, 18H). HRMS (positive ESI) found 853.3511 [M+H]$^+$; calcd for $C_{46}H_{47}AuN_4$ (m/z) 853.3539.

Compound 11: [Au{$^t$BuC^N$^{TRZ}$(C$_6$H$_4$-$^t$Bu)^C$^t$Bu}(3-9H-cbz-C$_{12}$H$_{25}$-9)]. Yield: 175 mg, 62%. $^1$H NMR (600 MHz, CDCl$_3$, 298 K, relative to Me$_4$Si, δ/ppm): δ 8.71 (d, J=10.2 Hz, 2H), 8.38 (s, 1H), 8.24 (d, J=9.6 Hz, 2H), 8.08 (d, J=9.6 Hz, 1H), 7.89-7.86 (m, 3H), 7.63 (d, J=10.2 Hz, 2H), 7.63 (d, J=10.2 Hz, 2H), 7.47-7.43 (m, 5H), 7.22-7.17 (m, 2H), 1.99-1.91 (m, 2H), 1.49-1.34 (m, 18H), 1.29-1.26 (m, 27H), 0.88-0.86 (m, 3H). HRMS (positive ESI) found 1007.5172 [M+H]$^+$; calcd for $C_{45}H_{45}AuN_4$ (m/z) 1007.5261.

Compound 12: [Au{$^t$BuC^N$^{TRZ}$(C$_6$H$_4$-$^t$Bu)^C$^t$Bu}(9-9H-cbz)]. Yield: 164 mg, 71%. $^1$H NMR (600 MHz, CDCl$_3$, 298 K, relative to Me$_4$Si, δ/ppm): δ 8.71 (d, J=10.2 Hz, 2H), 8.22 (d, J=9 Hz, 2H), 8.16 (d, J=9.6 Hz, 1H), 7.66 (d, J=10.2 Hz, 1H), 7.51 (d, J=9.6 Hz, 1H), 7.41-7.39 (m, 2H), 7.31-7.26 (m, 4H), 7.15 (t, J=9 Hz, 2H), 1.43 (s, 9H), 1.04 (s, 18H). HRMS (positive ESI) found 839.3366 [M+H]$^+$; calcd for $C_{45}H_{45}AuN_4$ (m/z) 839.3382.

Compound 13: [Au{$^t$BuC^N$^{TRZ}$(C$_6$H$_4$-$^t$Bu)^C$^t$Bu}(9-9H-cbz-$^t$Bu$_2$-3,6)]. Yield: 135 mg, 55%. H NMR (500 MHz, CDCl$_3$, 298 K, relative to Me$_4$Si, δ/ppm): δ 8.71 (d, J=8.5 Hz, 2H), 8.19 (s, 2H), 8.14 (d, J=8.0 Hz, 2H), 7.65 (d, J 7.5 Hz, 2H), 7.38-7.42 (m, 4H), 7.33-7.35 (m, 4H), 1.47 (s, 18H), 1.43 (s, 9H), 1.05 (s, 18H). HRMS (positive ESI) found 950.4538 [M+H]$^+$; calcd for $C_{53}H_{62}AuN_4$ (m/z) 950.4556.

Compound 14: [Au{$^t$BuC^N$^{TRZ}$(C$_6$H$_4$-Bu)^C$^t$Bu}(C≡CC$_6$H$_4$-$^t$Bu-4)]. Yield: 90 mg, 42%. $^1$H NMR (400 MHz, CDCl$_3$, 298 K, relative to Me$_4$Si, δ/ppm): δ 8.65 (d, J 9.0 Hz, 2H), 8.31 (d, J=2.0 Hz, 2H), 8.10 (d, J 8.0 Hz, 2H), 7.56-7.62 (m, 4H), 7.45 (dd, J=8.0, 2.0 Hz, 2H), 7.39 (d, J=8.6 Hz, 2H), 1.40-1.41 (m, 27H), 1.37 (s, 9H). HRMS (positive ESI) found 830.3786 [M+H]$^+$; calcd for $C_{40}H_{45}AuN_3O$ (m/z) 830.3743.

Compound 15: [Au{$^t$BuC^N$^{TRZ}$ (C$_6$H$_4$-$^t$Bu)^C$^t$Bu}(S—C$_6$H$_4$—CH$_3$-4)]. Yield: 123 mg, 60%. $^1$H NMR (500 MHz, CDCl$_3$, 298 K, relative to Me$_4$Si, δ/ppm): δ 8.67 (d, J=8.7 Hz, 2H), 8.15 (d, J=8.1 Hz, 2H), 7.61-7.65 (m, 4H), 7.42 (d, J=1.7 Hz, 2H), 7.38 (d, J=8.1 Hz, 4H), 7.07 (d, J=7.9 Hz, 2H), 2.34 (s, 3H), 1.41 (s, 9H), 1.23 (s, 18H). HRMS (positive ESI) found 795.2867 [M]+; calcd for $C_{40}H_{44}AuN_3S$ (m/z) 795.2916.

Compound 16: [Au{MeO-C^N$^{TRZ}$(C$_6$H$_4$—OMe)^C—OMe}(C$_6$H$_4$-$^t$Bu-4)]. Yield: 116 mg, 57%. $^1$H NMR (600 MHz, CDCl$_3$, 298 K, relative to Me$_4$Si, δ/ppm): δ 8.43 (dd, J=9, 1.8 Hz, 1H), 7.57-7.54 (m, 3H), 7.48 (t, J=9.0 Hz, 2H), 7.33 (d, J=9.6 Hz, 2H), 7.32-7.01 (m, 4H), 6.87 (d, J=10.2 Hz, 2H), 4.06 (s, 3H), 4.06 (s, 6H), 1.39 (s, 18H). HRMS (positive ESI) found 728.2167 [M+H]$^+$; calcd for $C_{34}H_{32}AuO_3N_3$ (m/z) 728.2182.

Compound 17: [Au{Me-C^N$^{TRZ}$(C$_6$H$_4$—OMe)^C—OMe}(C$_6$H$_4$—CF$_3$-4)]. Yield: 109 mg, 55%. $^1$H NMR (500 MHz, CDCl$_3$, 298 K, relative to Me$_4$Si, δ/ppm): δ 8.45-8.43 (m, 1H), 7.59-7.55 (m, 1H), 7.50-7.47 (m, 2H), 7.19-7.11 (m, 4H), 7.00 (d, J=8.4 Hz, 2H), 6.90 (d, J=10.2 Hz, 2H), 6.72-6.68 (m, 1H), 4.07 (s, 3H), 4.05 (s, 6H). HRMS (positive ESI) found 708.1343 [M+H]$^+$; calcd for $C_{30}H_{22}AuF_2N_3O_3$ (m/z) 708.1368.

Compound 18: [Au{$^t$BuC^N$^{pz}$^C$^t$Bu}(C$_6$H$_5$-4)]. Yield: 104 mg, 55%. $^1$H NMR (500 MHz, CDCl$_3$, 298 K, relative to Me$_4$Si, δ/ppm): δ 8.86 (s, 2H), 7.67 (d, J=8.2 Hz, 2H), 7.47-7.60 (m, 4H), 7.36 (d, J=8.4 Hz, 2H), 7.30 (dd, J=8.2, 2.0 Hz, 2H), 1.27 (s, 18H). HRMS (positive ESI) found 673.2879 [M+H]$^+$; calcd for $C_{34}H_{40}AuN_2$ (m/z) 673.2857.

Compound 19: [Au{$^t$BuC^N$^{pz}$^C$^t$Bu}(C$_6$H$_4$-9H-cbz-4)]. Yield: 79 mg, 36%. $^1$H NMR (500 MHz, CDCl$_3$, 298 K, relative to Me$_4$Si, δ/ppm): δ 8.90 (s, 2H), 8.18 (d, J=7.8 Hz, 2H), 7.92 (d, J=8.4 Hz, 2H), 7.71 (d, J=8.2 Hz, 2H), 7.61 (d, J=2.0 Hz, 2H), 7.52-7.56 (m, 4H), 7.45-7.47 (m, 2H), 7.29-7.44 (m, 4H), 1.31 (s, 18H). HRMS (positive ESI) found 782.2774 [M+H]$^+$; calcd for $C_{42}H_{39}AuN_3$ (m/z) 782.2804.

Compound 20: [Au{$^t$BuC^N$^{pz}$^C$^t$Bu}(3-9H-cbz-CH$_3$-9)]. Yield: 87 mg, 43%. $^1$H NMR (500 MHz, CDCl$_3$, 298 K, relative to Me$_4$Si, δ/ppm): δ 8.88 (s, 2H), 8.44 (s, 1H), 8.05 (d, J=7.7 Hz, 1H), 7.83 (dd, J=8.3, 1.3 Hz, 1H), 7.68-7.71 (m, 4H), 7.43-7.49 (m, 3H), 7.31 (dd, J=8.1, 2.0 Hz, 2H), 7.19-7.22 (m, 1H), 3.93 (s, 3H), 1.23 (s, 18H). HRMS (positive ESI) found 720.2621 [M+H]$^+$; calcd for $C_{37}H_{37}AuN_3$ (m/z) 720.2648.

Compound 21: [Au{$^t$BuC^N$^{pz}$^C$^t$Bu}(9-9H-cbz)]. Yield: 119 mg, 60%. $^1$H NMR (500 MHz, CDCl$_3$, 298 K, relative to Me$_4$Si, δ/ppm): δ 8.83 (s, 2H), 8.20 (d, J=7.8 Hz, 2H), 7.64 (d, J=8.2 Hz, 2H), 7.48 (d, J=8.2 Hz, 2H), 7.27-7.30 (m, 4H), 7.12-7.15 (m, 2H), 7.06 (d, J=1.9 Hz, 2H), 0.99 (s, 18H). HRMS (positive ESI) found 706.2444 [M+H]$^+$; calcd for $C_{36}H_{35}AuN_3$ (m/z) 706.2491.

Compound 22: [Au{$^t$BuC^N$^{pz}$^C$^t$Bu}(9-9H-cbz-$^t$Bu$_2$-3,6)]. Yield: 117 mg, 51%. $^1$H NMR (500 MHz, CDCl$_3$, 298 K, relative to Me$_4$Si, δ/ppm): δ 8.81 (s, 2H), 8.17 (d, J=1.7 Hz, 2H), 7.62 (d, J=8.2 Hz, 2H), 7.37 (d, J=8.6 Hz, 2H), 7.32 (dd, J=8.6, 1.9 Hz, 2H), 7.25-7.27 (m, 4H), 7.13 (d, J=1.9 Hz, 2H), 1.46 (s, 18H), 0.99 (s, 18H). HRMS (positive ESI) found 818.3722 [M+H]$^+$; calcd for $C_{44}H_{51}AuN_3$ (m/z) 818.3739.

Compound 23: [Au{$^t$BuC^N$^{pz}$^C$^t$Bu}(C≡CC$_6$H$_4$-$^t$Bu-4)]. Yield: 90 mg, 42%. $^1$H NMR (500 MHz, CDCl$_3$, 298 K, relative to Me$_4$Si, δ/ppm): δ 8.70 (s, 2H), 8.16 (d, J=2.0 Hz, 2H), 7.51-7.55 (m, 4H), 7.38 (d, J=8.5 Hz, 2H), 7.27 (dd, J=8.5, 2.0 Hz, 2H), 1.38 (s, 18H), 1.36 (s, 9H). HRMS (positive ESI) found 697.2801 [M+H]$^+$; calcd for $C_{36}H_{40}AuN_2$ (m/z) 697.2852.

Compound 24: [Au{$^t$BuC^N^C$^t$Bu}(C$_6$H$_4$-9H-cbz-4)]. Yield: 163 mg, 68%. $^1$H NMR (500 MHz, CDCl$_3$, 298 K, relative to Me$_4$Si, δ/ppm): δ 8.18 (d, J=7.8 Hz, 2H), 7.94 (d, J=8.2 Hz, 2H), 7.85 (t, J=8.0 Hz, 1H), 7.60-7.62 (m, 6H), 7.50-7.59 (m, 6H), 7.43-7.47 (m, 2H), 7.39-7.31 (m, 4H), 1.30 (s, 18H). HRMS (positive ESI) found 780.2741 [M]+; calcd for $C_{43}H_{39}AuN_2$ (m/z) 780.2773.

Example 2

UV-Vis Absorption Properties

Figure 5:
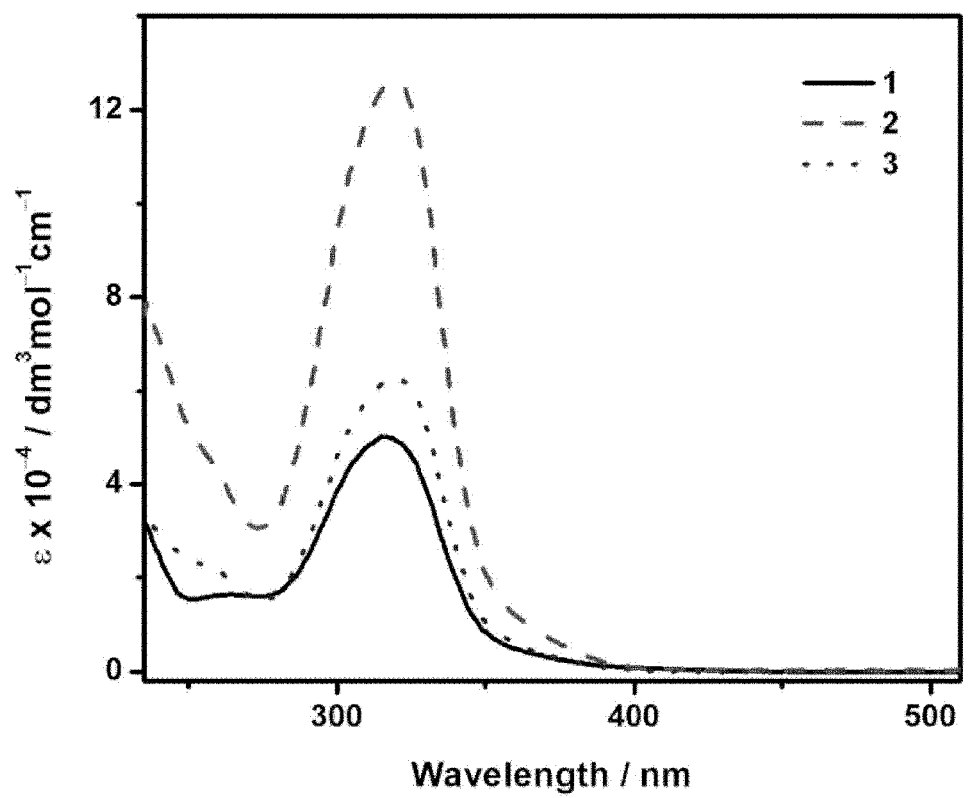
FIG. 5 shows a graphical representation of the UV-visible absorption spectra of compounds 1-3 in dichloromethane at 298 K, in accordance with one embodiment.

The UV-vis absorption spectra of representative compounds 1-3 as disclosed in FIG. 4 in dichloromethane at 298 K is provided for illustration purposes in FIG. 5. These compounds demonstrated intense structureless absorption bands at ca. 300-330 nm with extinction coefficients (F) in the order of $10^4$ $dm^3$ $mol^{-1}$ $cm^{-1}$, and a moderately intense absorption shoulder at ca. 260-280 nm (FIG. 5). The absorption shoulder is tentatively assigned as the intraligand (IL) $\pi \rightarrow \pi^*$ transition of the aromatic moieties. The structureless absorption band is tentatively assigned as the IL charge transfer (ILCT) transition of the cyclometalating tridentate ligands from the aryl ring to the triazine moiety that mixed with the ligand-to-ligand charge transfer (LLCT) $\pi$[auxiliary ligand]$\rightarrow \pi^*$[C^N^C] transition. The assignment of a metal-to-ligand charge transfer transition is unlikely due to the non-reducing nature of the gold(III) center to achieve gold (IV) higher oxidation state. The UV-visible absorption data of selected compounds 1-3 in dichloromethane at 298 K is summarized in TABLE 1, provided below. The UV-vis absorption and emission spectra of representative compounds 1-3 provide the fundamental photophysical data that offer useful guidelines for the design of the chemical structures to tune the emission color of the emitters in both the solution and the solid state.

TABLE 1

Photophysical data for representative compounds 1-3

| Compound | Medium (T/K) | Absorption $\lambda_{max}$/nm ($\varepsilon_{max}$/$dm^3mol^{-1}cm^{-1}$) | Emission $\lambda_{max}$/nm ($\tau_o$/μs) | $\Phi_{sol}$[a] | $\Phi_{film}$[b] |
|---|---|---|---|---|---|
| 1 | $CH_2Cl_2$ (298) | 264 (16500), 316 (50120) | 545 (0.3) | 0.02 | |
| | Thin film (300) 10% in PYD-2Cz | | 500 (11.1) | | 0.33 |
| | Thin film (77) 10% in PYD-2Cz | | 499 (109, 395) | | |
| | Solid (300) | | 503 (13.4) | | |
| | Solid (180) | | 527 (12.2, 289) | | |
| 2 | $CH_2Cl_2$ (298) | 259 (4330), 320 (126050) | 549 (<0.1) | 0.002 | |
| | Thin film (300) 10% in PYD-2Cz | | 490 (11.0) | | 0.28 |
| | Thin film (77) 10% in PYD-2Cz | | 487 (113, 424) | | |
| | Solid (300) | | 506 (11.6) | | |
| | Solid (180) | | 567 (12.2, 224) | | |
| 3 | $CH_2Cl_2$ (298) | 260 sh (21290), 319 (62600) | 545 (<0.1) | 0.001 | |
| | Thin film (300) 10% in PYD-2Cz | | 491 (11.0) | | 0.41 |
| | Thin film (77) 10% in PYD-2Cz | | 487 (71.7, 321) | | |
| | Solid (300) | | 449, 476, 505 (11.6) | | |
| | Solid (77) | | 449, 478, 503 (23.6, 69.2) | | |

[a]The relative luminescence quantum yield in solution was measured at room temperature using quinine sulfate in 0.5M $H_2SO_4$ as the reference (excitation wavelength = 365 nm, $\Phi_{lum}$ = 0.546)
[b]Absolute luminescence quantum yield of thin films was measured with 320 nm excitation Example 3

Emission Properties and Thermal Stabilities

Figure 6:
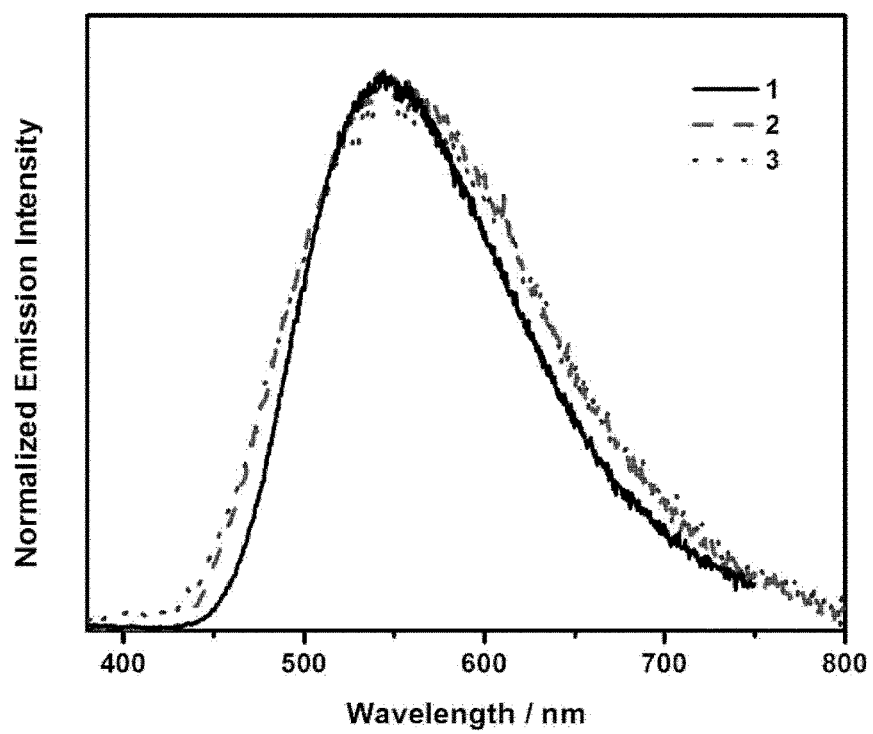
FIG. 6 shows a graphical representation of the normalized PL spectra of compounds 1-3 in dichloromethane at 298 K, in accordance with one embodiment.
Figure 7:
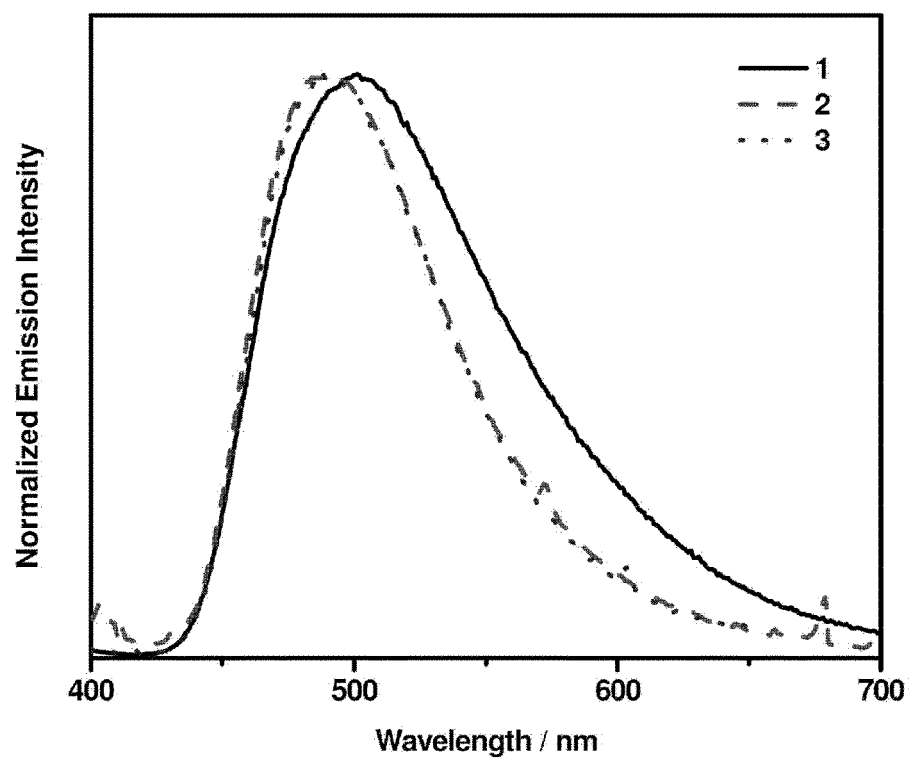
FIG. 7 shows a graphical representation of the normalized PL spectra of thin films of 10 wt % of compounds 1-3 doped into a 2,6-di(9H-carbazol-9-yl)pyridine (PYD-2Cz) host at 300 K, in accordance with one embodiment.
Figure 8:
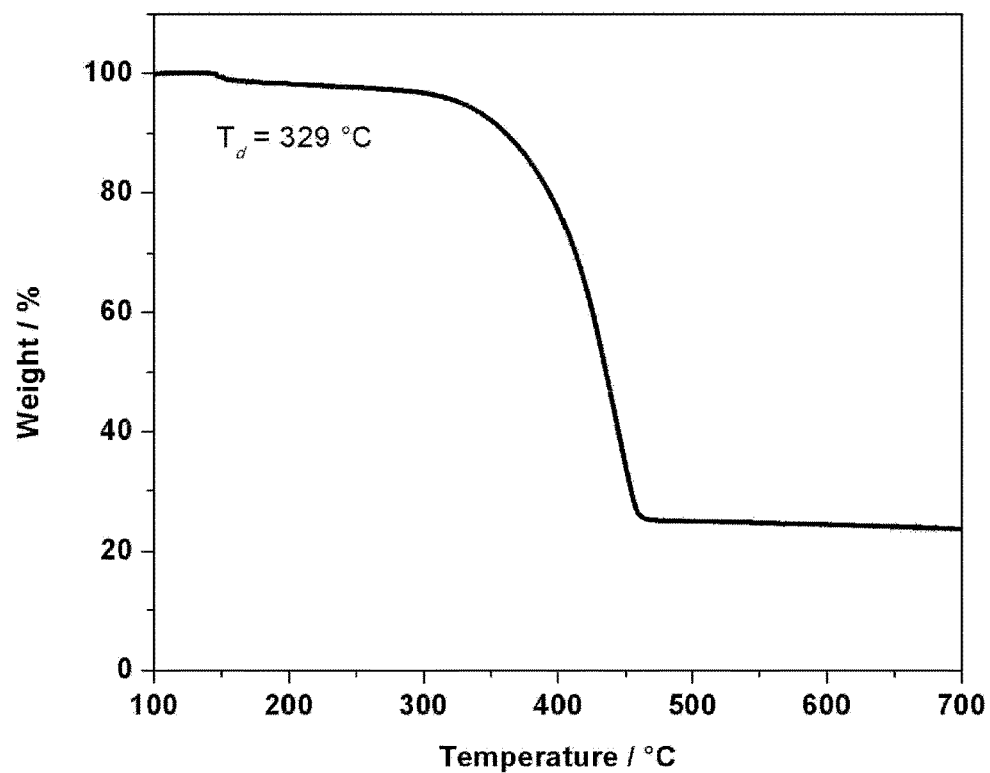
FIG. 8 shows a graphical representation of the thermogravimetric trace of compound 1.
Figure 9:
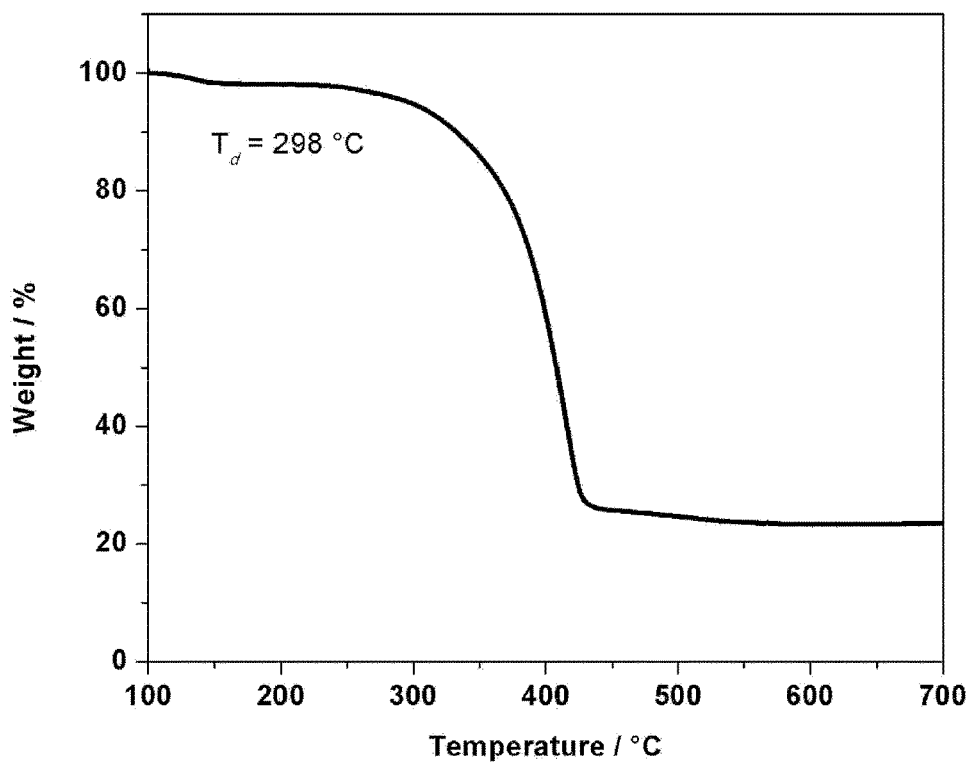
FIG. 9 shows a graphical representation of the thermogravimetric trace of compound 2.
Figure 10:
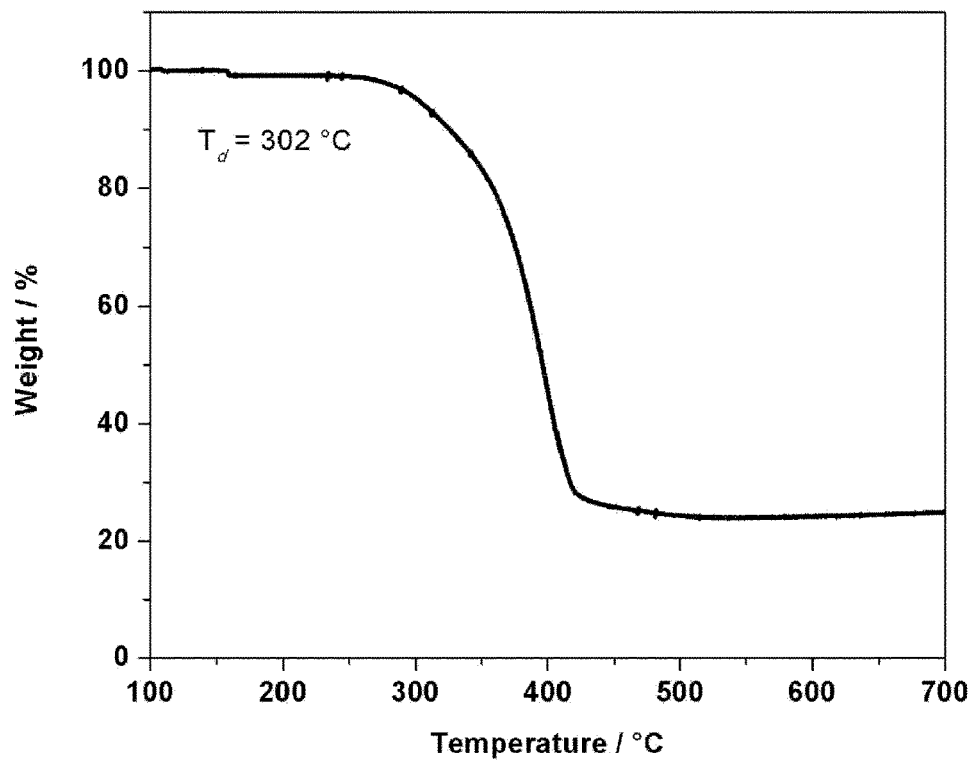
FIG. 10 shows a graphical representation of the thermogravimetric trace of compound 3.

As shown by TABLE 1, representative compounds 1-3 display yellow luminescence in solution state. The emission spectra in degassed dichloromethane solution are shown in FIG. 6. Upon excitation at λ=365 nm in dichloromethane solution at 298 K, structureless emission bands with peak maxima at ca. 545 nm are observed. The emission maxima of representative compounds 1-3 are almost identical, suggesting the emission is insensitive to the nature of the auxiliary ligand. These emission bands are tentatively assigned as originating from the $^3$ILCT transition of the cyclometalating tridentate ligands from the aryl ring to the triazine moiety. On the other hand, the emission maximum is significantly blue-shifted when doped into thin films. FIG. 7 shows the normalized PL spectra of thin films of 10 wt % of compounds 1-3 doped into PYD-2Cz at 300 K. All compounds display intense luminescence at 490-500 nm with respectable PLQYs. As compared to those in solution, significant blue shifts of 1854-2060 cm¹ were observed for the representative compounds 1-3, due to a change in emission origin from ³ILCT state to 3IL (π→π*) state with some ³ILCT and ³LLCT characters. Advantageously, there is no significant spectral shift in the emission spectra for compounds with various auxiliary ligands, which is quite different from those observed in conventional platinum(II) and gold(III) systems. In this way, the emission energies of this class of compounds can be precisely controlled via the modification of the cyclometalating tridentate ligands. It is worth noting that the gold(III) compounds as disclosed herein in one or more embodiments show high thermal stability. As depicted in FIGS. 8-10, thermogravimetric analysis (TGA) data reveals that these compounds exhibit high decomposition temperatures of about 300° C.

Example 4

Temperature Dependent Emission Properties and Lifetimes

Figure 11:
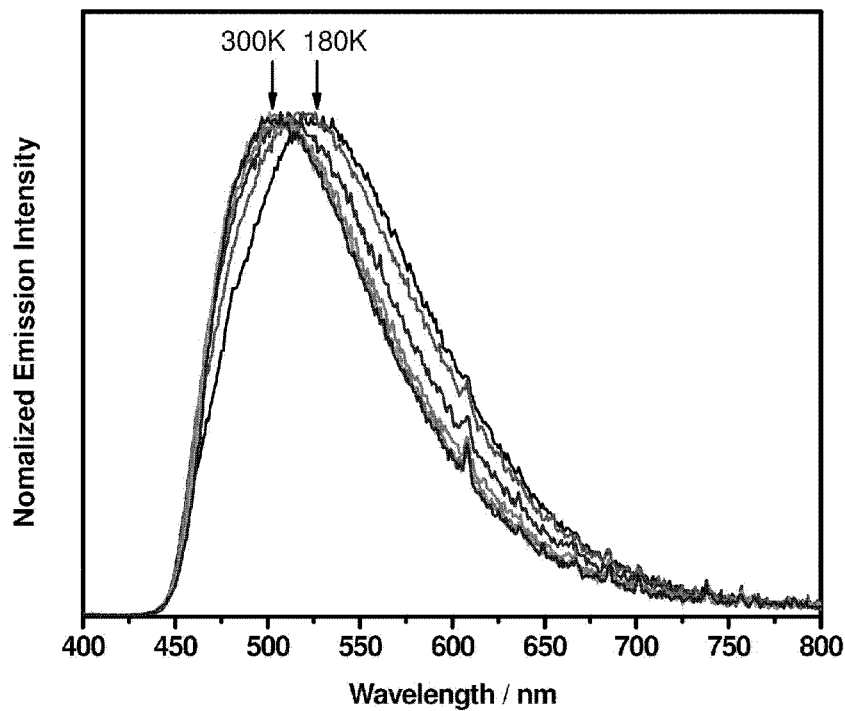
FIG. 11 shows a graphical representation of the solid-state emission spectra of 1 at different temperatures from 180 K to 300 K upon excitation at 360 nm.
Figure 12:
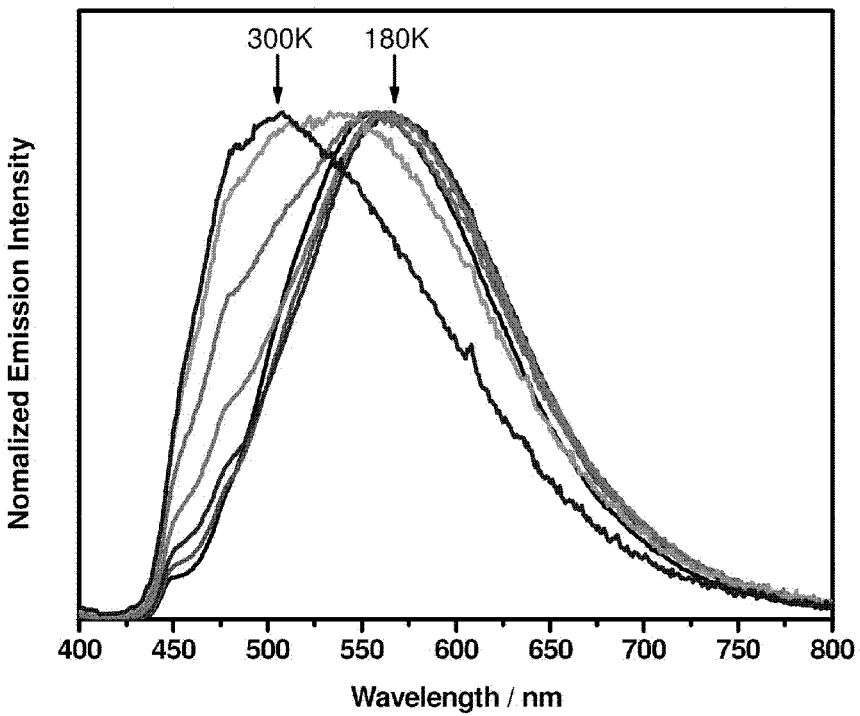
FIG. 12 shows a graphical representation of the solid-state emission spectra of 2 at different temperatures from 180 K to 300 K upon excitation at 360 nm.
Figure 13:
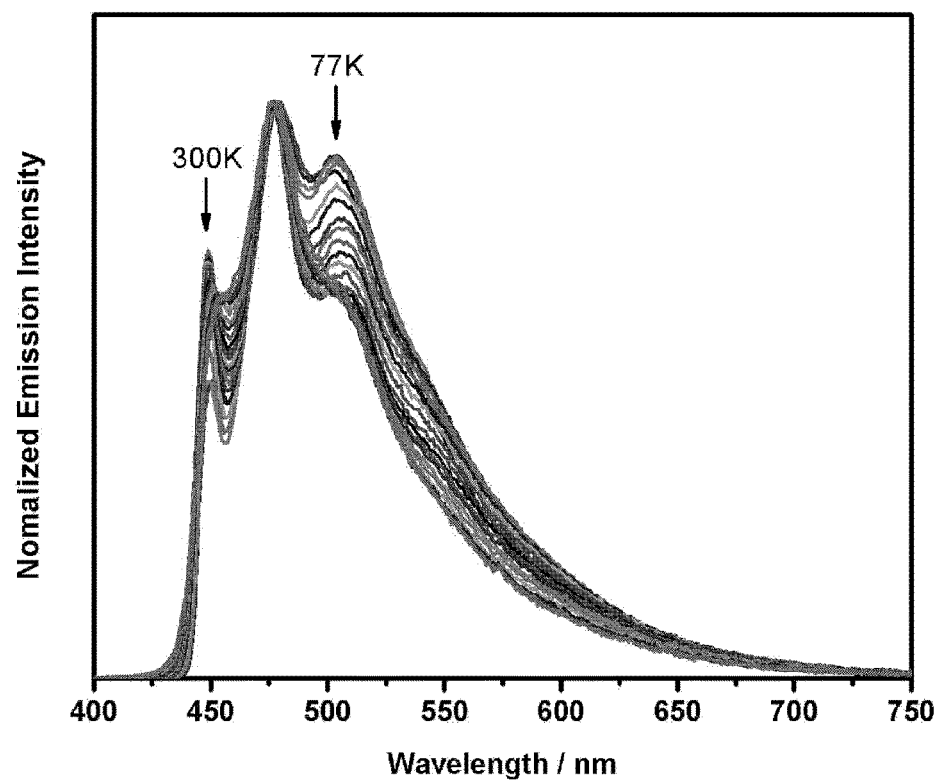
FIG. 13 shows a graphical representation of the solid-state emission spectra of 3 at different temperatures from 77 K to 300 K upon excitation at 340 nm.
Figure 14:
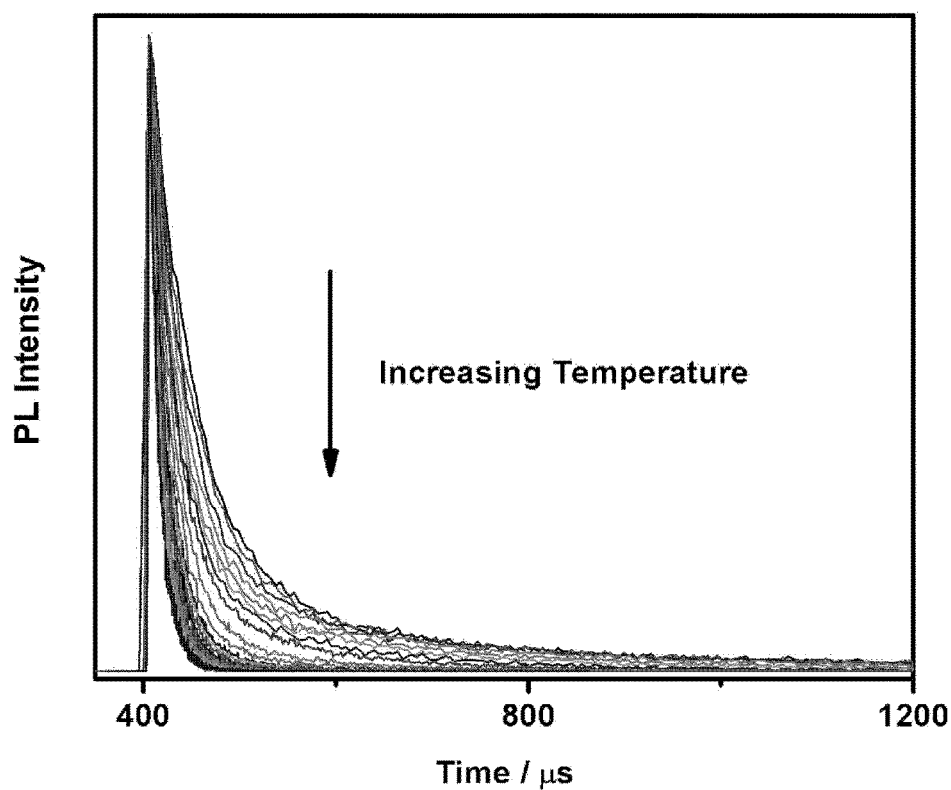
FIG. 14 shows a graphical representation of the PL decay profiles for 3 in solid state at 77-300 K.
Figure 15:
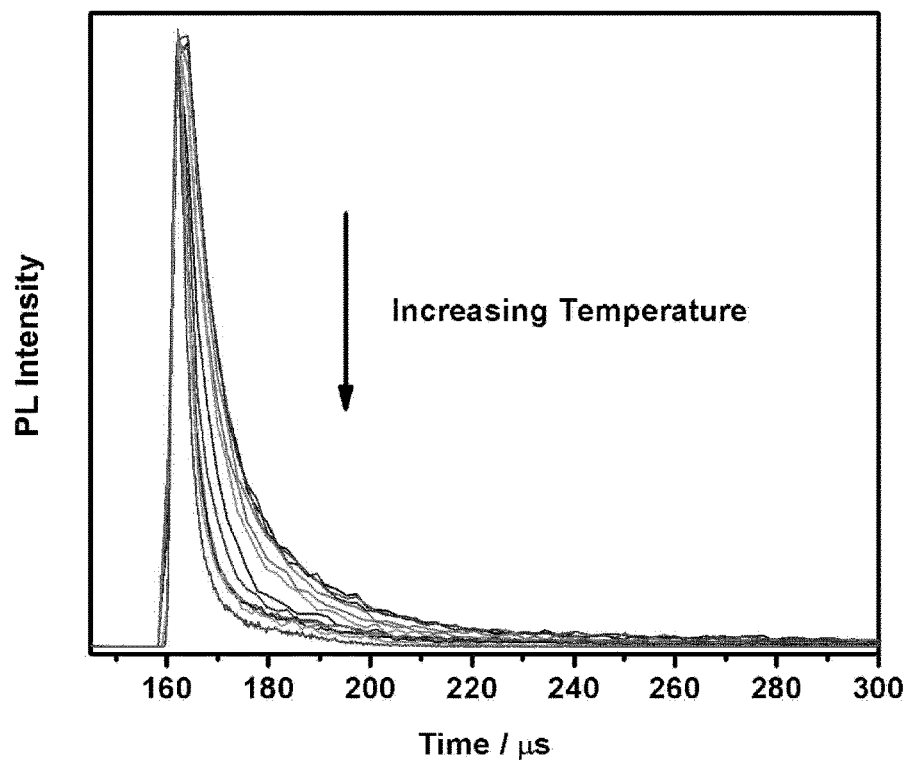
FIG. 15 shows a graphical representation of the PL decay profiles for 1 in solid state at 77-300 K.
Figure 16:
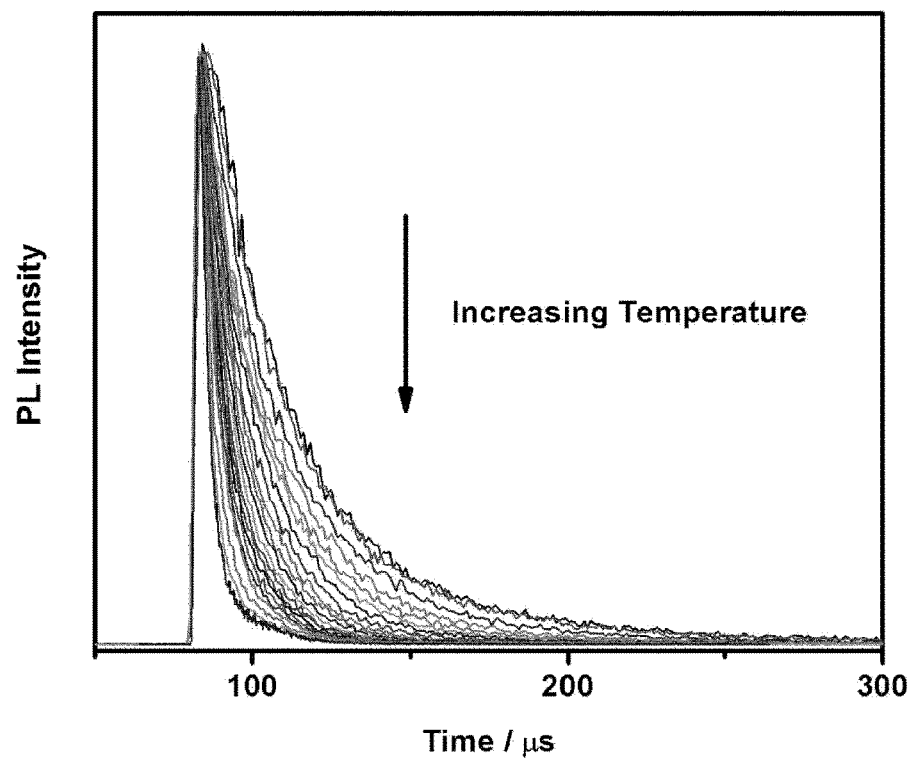
FIG. 16 shows a graphical representation of the PL decay profiles for 2 in solid state at 77-300 K.

To confirm the occurrence of the TSDP mechanism, temperature-dependent emission properties of the gold(III) compounds in solid state were investigated and compounds 1-3 are used for exemplary illustration. The emission spectra of compounds 1 and 2 in the solid state at different temperatures from 180 K to 300 K, and that of compound 3 from 77 K to 300 K are shown in FIGS. 11-13, respectively. In general, a progressive blue-shift of emission bands of all the compounds is observed upon increasing the temperature, each with a different onset temperature depending on the nature of the auxiliary ligands. Specifically, the thermal energy of molecules at low temperatures is significantly reduced, and the process of up-conversion is no longer or only partially allowed via thermal equilibrium. This results in emission band mixing of the $T_1'$ and $T_1$ excited states, given the energies of the two excited states are in close proximity. $T_1$ excited state is originated predominantly from the ³ILCT state (with some mixing of ³LLCT character), and the $T_1'$ excited state is originated predominantly from the 3IL (π→π*) state (with some mixing of ³ILCT and ³LLCT characters), respectively. Upon increasing the temperature, it is anticipated that more excitons can gain enough thermal energy to overcome the energy gap $\Delta_{T_1'-T_1}$ between $T_1$ and $T_1'$ excited states, yielding a blue-shifted emission band from the $T_1'$ excited state. Notably, compound 3 shows a clear vibronic-structured emission band with peak maximum at 480 nm, and the vibrational progressional spacings of ca. 1300 cm-1 match well with the v(C≡C) and v(C≡N) stretching modes of the tridentate ligand, suggesting an involvement of the tridentate ligand-based excited state. For example, the excited state lifetime decays of compound 3 at 240 K to 300 K can be well fitted to the single exponential model, indicating the emission band is originated from a single emissive state (FIG. 14). On the contrary, a bi-exponential model is used for fitting in the temperature range of 77 K to 230 K, indicating that the up-conversion progress is inefficient or only partial, leading to dual emissive state character. This supports the importance of thermal energy in the up-conversion process. Similar phenomenon is observed in compounds 1 and 2 (FIGS. 15-16). The temperature-dependent emission and lifetime measurements of compounds 1-3 in the solid state are summarized in TABLE 1. The long lifetimes in microsecond range and large Stokes shifts for both emission bands at high and low temperatures illustrate their triplet origins. In addition, temperature-dependent lifetime studies of the compounds doped into PYD-2Cz at 10 wt % revealed that the excited state decays of compound 3 at 77 K to 250 K can be well fitted to a bi-exponential model, while at 275 K to 300 K a single exponential decay is observed (TABLE 1). Similar phenomenon is observed in compounds 1 and 2. This demonstrates that the emission is originated from one single emissive state at higher temperature, but two separate independent emissive states at lower temperature, which are in line with the observations in the solid state. The lack of blue-shift in emission maximum in solid state PYD-2Cz thin-film with increasing temperature is attributed to the very small $\Delta_{T_1'-T_1}$.

Example 5

An exemplary vacuum-deposited OLED according to an embodiment was constructed in the following manner.

A transparent anode ITO-coated borosilicate glass substrate (38 mm×38 mm) with sheet resistance of 30Ω per square was ultrasonicated in the commercial detergent Decon 90, rinsed in deionized water having a resistivity of 18.2 mega-ohm for 15 minutes, and then dried in an oven at 120 degree C. for at least an hour. The substrate was next subjected to an UV-ozone treatment in a Jelight 42-220 UVO-Cleaner equipped with a mercury grid lamp for 15 minutes in order to increase the work function of the ITO-coated glass substrate for better hole injection into the organic layer.

The substrate was put into a vacuum chamber, and the chamber was pumped down from 1 bar to $5\times10^{-6}$ mbar.

A 40-nm thick α-NPD hole-blocking layer was deposited by thermal evaporation onto the doped light-emitting layer of step b.

A 25-nm thick light-emitting layer was deposited by thermal evaporation onto the α-NPD layer of step c, in which compound 1 was doped into a 2,6-di(9H-carbazol-9-yl)pyridine (PYD-2Cz) host at different concentrations in the range from 2 to 14 wt %.

A 5-nm thick diphenyl-4-triphenylsilylphenyl-phosphine oxide (TSPO1) hole-blocking layer was deposited by thermal evaporation onto the doped light-emitting layer of step d.

A 35-nm thick 1,3,5-tris(6-(3-(pyridine-3-yl)phenyl)pyridine-2-yl)benzene (Tm3Py26PyB) electron-transporting layer was deposited by thermal evaporation onto the TSPO1 layer of step e.

A 1-nm thick LiF layer and a 150-nm thick Al layer were deposited by thermal evaporation onto the Tm3Py26PyB layer of step f to form an electron-injecting cathode.

α-NPD, TSPO1, Tm3Py26PyB, LiF and Al were prepared by thermal evaporation from tantalum boats by applying current through the tantalum boats. Deposition rates were monitored with a quartz oscillation crystal and controlled at 0.1-0.2 nm s¹ for both organic and metal layers. Current density-voltage-luminance characteristics of organic EL devices were measured with a programmable Keithley model 2420 power source and a Spectrascan PR-655 colorimeter under ambient air conditions.

Example 6

The same materials and processing procedures were employed as described in Example 5, except that compound 2 was doped into PYD-2Cz as the light-emitting layer.

Example 7

The same materials and processing procedures were employed as described in Example 5, except that compound 3 was doped into PYD-2Cz as the light-emitting layer.

Figure 17:
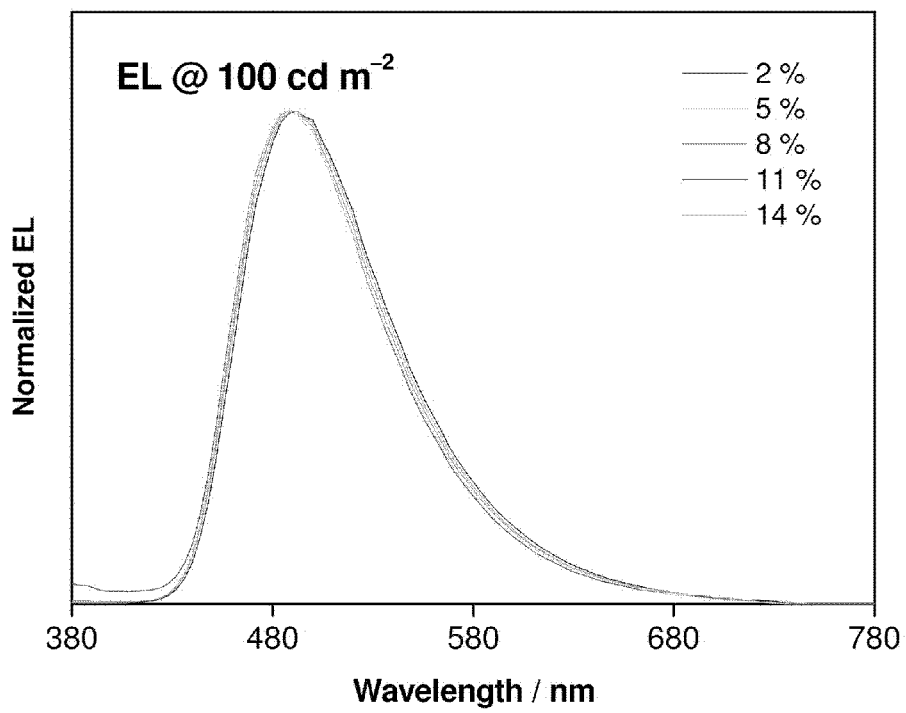
FIG. 17 shows a graphical representation of the normalized EL spectra of vacuum-deposited OLEDs made with compound 1.
Figure 18:
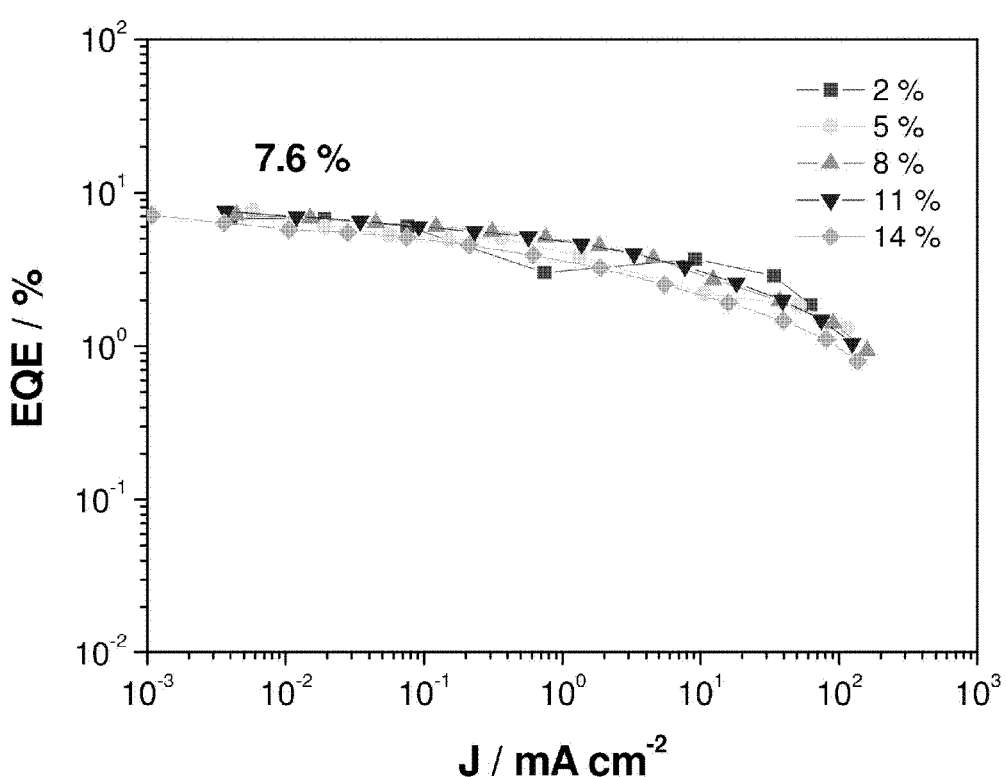
FIG. 18 shows a graphical representation of the EQEs of vacuum-deposited OLEDs made with compound 1.

As depicted in FIG. 17, all devices exhibit Gaussian-shaped emission and the EL spectra are almost identical to the emission spectrum of 1 in doped thin film. The Commission Internationale de L'Eclairage (CIE) coordinates that correspond to the color of the emitted light are almost constant over a wide range of dopant concentrations. As dopant concentration is increased from 2 wt % to 14 wt %, the CIE x and y values only had small changes of ±0.01 and ±0.02 for, respectively. Further, the EL peak maxima are different from that of compound 1 in solution, and in good agreement with the solid-state thin film studies. The emission maximum is almost identical to that of the thin film PL spectra, suggesting an identical emission origin, which is from the higher-lying $T_1'$ excited state. Also, there is no emission arising from PYD-2Cz, which indicates a complete energy transfer from the host to the dopant. The observation of the concentration-independent EL properties also confirms that the EL is merely coming from the higher $T_1'$ excited state. It is not the case for most of the other $d^8$ square-planar metal complexes, including platinum(II) and gold(III) systems, where the EL spectra are found to show a significant spectral shift upon dopant aggregation to give a broad red-shifted excimer emission. These concentration-independent EL properties are extremely valuable for the precise control of the emission energies of the gold(III) compounds via the modification of the cyclometalating ligands as well as the color purity of the OLEDs. In addition, high current efficiencies and EQEs of up to 18.7 cd $A^{-1}$ and 7.600, respectively, can be obtained (FIG. 18).

Figure 19:
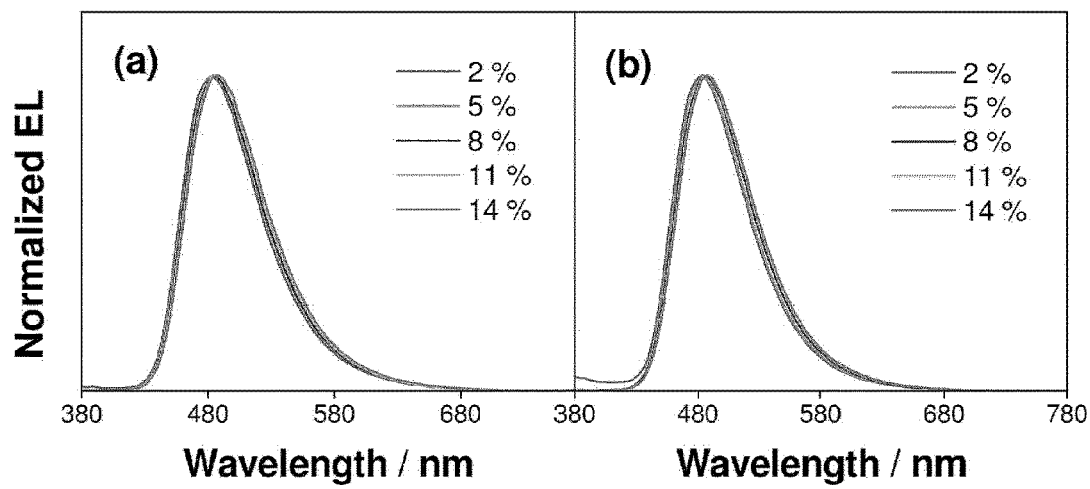
FIG. 19 shows a graphical representation of the normalized EL spectra of vacuum-deposited OLEDs made with compounds (a) 2 and (b) 3 at luminance of 100 cd m$^{-2}$.
Figure 20:
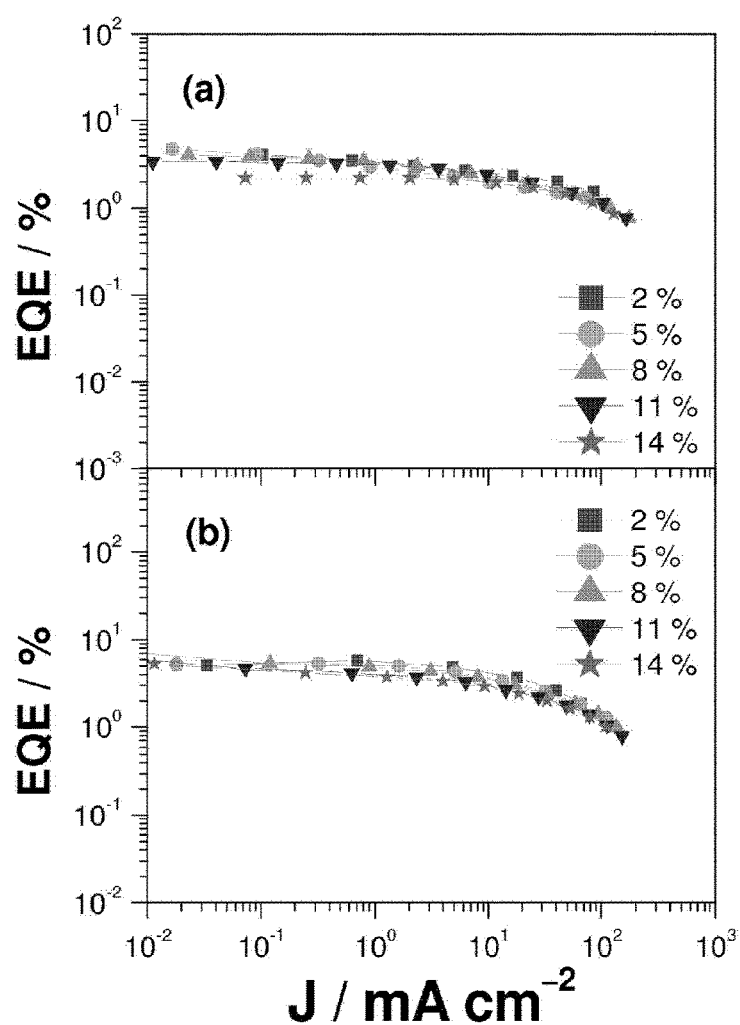
FIG. 20 shows a graphical representation of the EQEs of vacuum-deposited OLEDs made with compounds (b) 2 and (c) 3.

Similar to the case of compound 1, the emission energies in the EL spectra are almost identical to the PL spectra in thin film for both compounds 2 and 3, demonstrating an identical emission origin. Also, the host emission is not observed, indicating a complete energy transfer to the dopant. In particular, nice blue emission with peak maxima at ca. 484 nm can be realized for both devices and CIE x and y coordinates of approximately (0.17, 0.36). (FIG. 19). In addition, high current efficiencies of up to 10.4 cd $A^{-1}$ and 17.6 cd $A^{-1}$ (corresponding to EQEs of 4.7% and 7.7%) can be achieved for devices based on 2 and 3, respectively (FIG. 20).

Example 8

Solution-processable OLEDs according to an embodiment were constructed in the following manner.

A transparent anode ITO-coated borosilicate glass substrate (38 mm×38 mm) with sheet resistance of 30Ω per square was ultrasonicated in the commercial detergent Decon 90, rinsed in deionized water having a resistivity of 18.2 mega-ohm for 15 minutes, and then dried in an oven at 120 degree C. for at least an hour. The substrate was next subjected to an UV-ozone treatment in a Jelight 42-220 UVO-Cleaner equipped with a mercury grid lamp for 15 minutes in order to increase the work function of the ITO-coated glass substrate for better hole injection into the organic layer.

A 70-nm thick PEDOT:PSS hole-transporting layer was spin-coated by using a spin processor at 7000 rpm for 30 seconds onto the ITO-coated glass substrate of step a and baked at 100 degree C. for 10 minutes in air.

A 60-nm thick light-emitting layer was spin-coated by using a spin processor at 6000 rpm for 25 seconds onto PEDOT:PSS layer of step b, and baked at 80 degree C. for 10 minutes in air, in which compound 1 was doped into PYD-Cz2 host at different concentrations in the range from 5 to 20 wt %.

The substrate was put into a vacuum chamber, and the chamber was pumped down from 1 bar to 5×10−6 mbar.

A 30-nm thick 3TPyMB hole-blocking layer was deposited by thermal evaporation onto the doped light-emitting layer of step c.

A 30-nm thick TmPyPB electron-transporting layer was deposited by thermal evaporation onto the 3TPyMB layer of step e.

A 1-nm thick LiF layer and a 120-nm thick Al layer were deposited by thermal evaporation onto the TmPyPB layer of step f to form an electron-injecting cathode.

3TPyMB, TmPyPB, LiF and Al were prepared by thermal evaporation from tantalum boats by applying current through the tantalum boats. Deposition rates were monitored with a quartz oscillation crystal and controlled at 0.1-0.2 nm $s^{-1}$ for both organic and metal layers. Current density-voltage-luminance characteristics of organic EL devices were measured with a programmable Keithley model 2420 power source and a Spectrascan PR-655 colorimeter under ambient air conditions.

Example 9

The same materials and processing procedures were employed as described in Example 8, except that compound 2 was doped into PYD-2Cz as the light-emitting layer.

Example 10

The same materials and processing procedures were employed as described in Example 8, except that compound 3 was doped into PYD-2Cz as the light-emitting layer.

Figure 21:
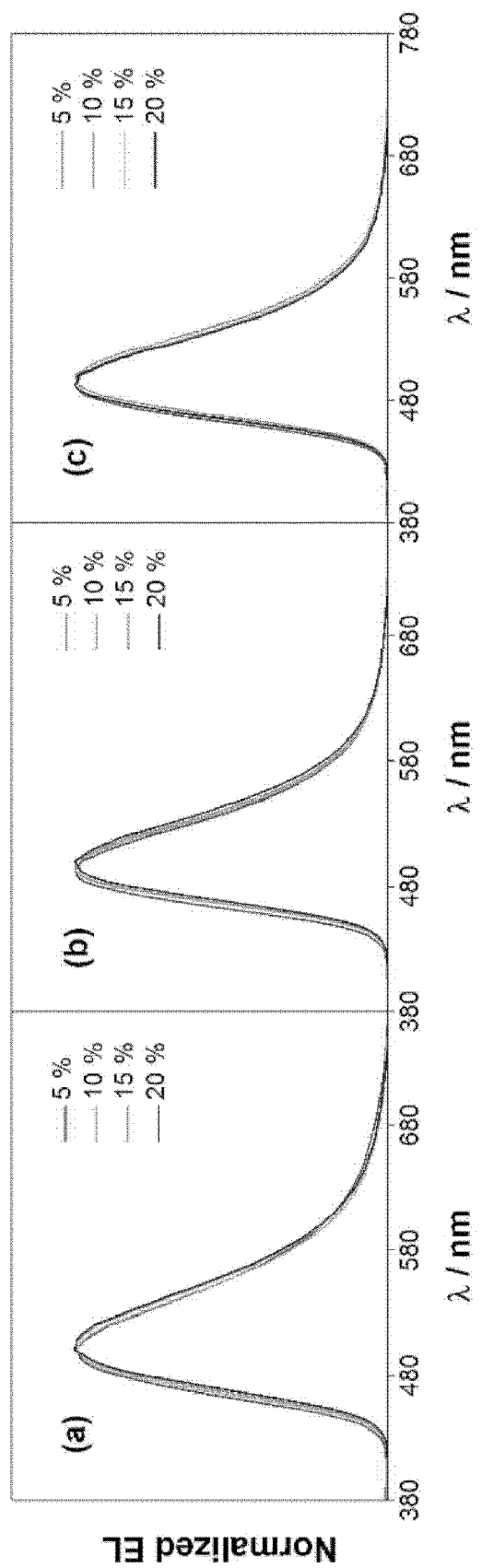
FIG. 21 shows a graphical representation of the normalized EL spectra of solution-processable OLEDs made with compounds 1-3 at luminance of 100 cd m$^2$.

FIG. 21 depicts the EL spectra of solution-processable OLEDs based on representative compounds 1-3, in which the EL maxima are found to be almost identical to that of the PL maximum, confirming the equivalent emission origins for EL and PL. Notably, all the EL spectra are independent on the dopant concentration, yielding a nice blue emission at 488 nm for devices based on compound 1 and 484 nm for devices based on compounds 2 and 3. Satisfactory performance with maximum current efficiencies of up to 12.2 cd $A^{-1}$ and maximum EQE of up to 4.7% can be achieved for solution-processable OLEDs.

What is claimed:

1. A light-emitting device with an ordered structure comprising an anode, a hole-transporting layer, a light-emitting layer, an electron-transporting layer and a cathode, wherein the light-emitting layer comprises a luminescent gold (III) compound that exhibits thermally stimulated delayed phosphorescence (TSDP), wherein the luminescent gold (III) compound has the chemical structure shown in formula (I),

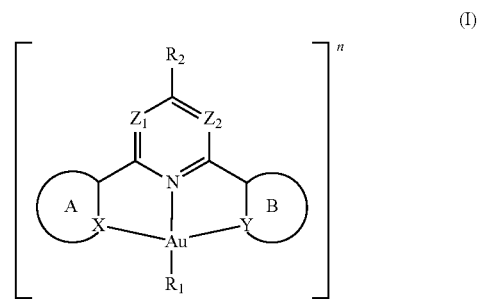

(I)

wherein:
(a) X and Y are each nitrogen or carbon;
(b) Z1 and Z2 are both nitrogen, Z1 is nitrogen and Z2 is carbon, or Z1 is carbon and Z2 is nitrogen;
(c) A and B are benzene, cyclic structure derivatives of unsubstituted or substituted phenyl groups, or cyclic structure derivatives of unsubstituted or substituted heterocyclic groups;
d) $R_1$ is a substituted aryl wherein a substituent of the substituted aryl of $R_1$ is a sulfanyl or a pentasulfanyl;
(e) $R_2$ is selected from the group consisting of alkyl, substituted alkyl, aryl, substituted aryl, heteroaryl, substituted heteroaryl, heterocyclic, substituted heterocyclic, alkoxy, amide, thiolate, phosphide, chloride, thiocyanate and cyanide; and
(f) n is zero, a positive integer or a negative integer.

2. The light-emitting device of claim 1, wherein the light-emitting layer is prepared using vacuum deposition or solution processing technique.

3. The light-emitting device of claim 1, wherein the light emitting layer comprises the material for light-emitting device as a dopant material.

4. The light-emitting device of claim 1, wherein the light-emitting layer comprises a dopant material, and wherein the dopant material comprises the luminescent gold (III) compound shown in formula (I).

5. The light-emitting device of claim 1, wherein rings A and B are independently benzene, phenyl derivatives, heterocycle or heterocyclic derivatives, with one or more substituents selected from the group consisting of alkyl, alkenyl, alkynyl, aryl, cycloalkyl, OR, $NR_2$, SR, C(O)R, C(O)OR, C(O)$NR_2$, CN, $CF_3$, $NO_2$, $SO_2$, SOR, $SO_3$R, halo, aryl, substituted aryl, heteroaryl, substituted heteroaryl, heterocyclic and substituted heterocyclic, wherein R is independently alkyl, alkenyl, alkynyl, alkyaryl, aryl, or cycloalkyl.

6. The light-emitting device of claim 1, wherein the gold (III) compound is deposited as a thin layer on a substrate.

7. The light-emitting device of claim 6, wherein the thin layer is deposited by vacuum deposition, spin-coating, or inkjet printing.

8. The light-emitting device of claim 1, wherein the gold (III) compound has photoluminescence properties within a range of about 380 to 1050 nm.

9. The light-emitting device of claim 1, wherein the gold (III) compound emits light in response to the passage of an electric current through the compound or to a strong electric field.

10. An OLED comprising the light-emitting device of claim 1.

11. The OLED of claim 10, wherein the gold (III) compound is a dopant in the light-emitting layer of the OLED.

12. The OLED of claim 10, wherein an emission energy of the OLED is independent of a concentration of the gold (III) compound and one or more donor groups on an auxiliary ligand, wherein the one or more donor group are selected from the group consisting of N, S, O and P.

13. The light-emitting device of claim 1, wherein A, B and $R_2$ are substituted by alkyl groups.

14. The light-emitting device of claim 1, wherein A, B and $R_2$ are 4-(tert-butyl)phenyl.

15. The light-emitting device of claim 1, wherein A, B and $R_2$ are 2-methoxy phenyl.

16. A light-emitting device with an ordered structure comprising an anode, a hole-transporting layer, a light-emitting layer, an electron-transporting layer and a cathode, wherein the light-emitting layer comprises a luminescent gold (III) compound that exhibits thermally stimulated delayed phosphorescence (TSDP), wherein the luminescent gold (III) compound has the chemical structure shown in formula (I):

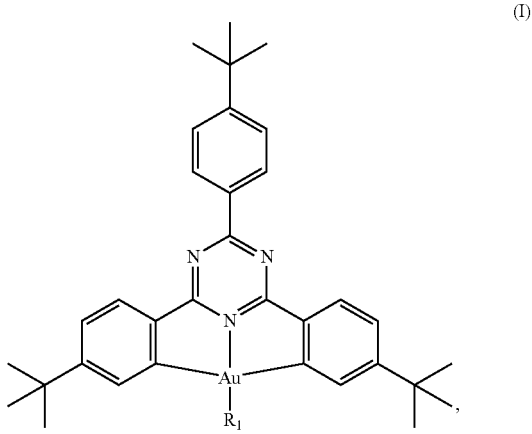

wherein $R_1$ is 4-(pentafluorosulfanyl)phenyl, 4-(triphenylsilyl)phenyl, 4-methoxyphenyl or p-tolylthio.

17. The light-emitting device of claim 16, wherein the light-emitting layer is prepared using vacuum deposition or solution processing technique.

18. The light-emitting device of claim 16, wherein the light emitting layer comprises the material for light-emitting device as a dopant material.

19. The light-emitting device of claim 16, wherein the light-emitting layer comprises a dopant material, and wherein the dopant material comprises the luminescent gold (III) compound shown in formula (I).

20. The light-emitting device of claim 16, wherein the gold (III) compound is deposited as a thin layer on a substrate.

21. The light-emitting device of claim 20, wherein the thin layer is deposited by vacuum deposition, spin-coating, or inkjet printing.

22. The light-emitting device of claim 16, wherein the gold (III) compound has photoluminescence properties within a range of about 380 to 1050 nm.

23. The light-emitting device of claim 16, wherein the gold (III) compound emits light in response to the passage of an electric current through the compound or to a strong electric field.

24. An OLED comprising the light-emitting device of claim 16.

25. The OLED of claim 24, wherein the gold (III) compound is a dopant in the light-emitting layer of the OLED.

26. The OLED of claim 24, wherein an emission energy of the OLED is independent of a concentration of the gold (III) compound and one or more donor groups on an auxiliary ligand, wherein the one or more donor group are selected from the group consisting of N, S, O and P.

* * * * *